(12) United States Patent
Chia et al.

(10) Patent No.: US 8,304,894 B2
(45) Date of Patent: Nov. 6, 2012

(54) SUPER HIGH-DENSITY MODULE WITH INTEGRATED WAFER LEVEL PACKAGES

(75) Inventors: Yong Poo Chia, Singapore (SG); Suan Jeung Boon, Singapore (SG); Siu Waf Low, Singapore (SG); Yong Loo Neo, Singapore (SG); Bok Leng Ser, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/712,152

(22) Filed: Feb. 28, 2007

(65) Prior Publication Data

US 2007/0145558 A1  Jun. 28, 2007

Related U.S. Application Data

(62) Division of application No. 10/167,284, filed on Jun. 11, 2002, now Pat. No. 7,579,681.

(30) Foreign Application Priority Data

May 21, 2002  (SG) .................................. 200203050

(51) Int. Cl.
*H01L 23/528* (2006.01)
*H01L 23/538* (2006.01)
*H01L 21/8239* (2006.01)

(52) U.S. Cl. . 257/700; 257/698; 257/774; 257/E23.169; 257/E23.17; 438/637

(58) Field of Classification Search .............. 438/25–26, 438/51, 55, 64, 106–127, 15, 629, 630, 637–640, 438/668, 672, 675; 257/678–733, 787–796, 257/E23.001–E23.194, 621, 774, E23.169–E23.178, 257/E21.575–E21.597, E21.627, E21.641

See application file for complete search history.

(56) References Cited

U.S. PATENT DOCUMENTS

| | | | |
|---|---|---|---|
| 3,189,978 A | 6/1965 | Stetson |
| 3,216,028 A | 11/1965 | Wyatt |
| 3,835,530 A | 9/1974 | Kilby |
| 4,783,695 A | 11/1988 | Eichelberger et al. |
| 4,918,811 A | 4/1990 | Eichelberger et al. |

(Continued)

FOREIGN PATENT DOCUMENTS

JP   404107846   4/1992

(Continued)

*Primary Examiner* — Matthew Landau
*Assistant Examiner* — Maliheh Malek
(74) *Attorney, Agent, or Firm* — TraskBritt

(57) ABSTRACT

A wafer level package, and a semiconductor wafer, electronic system, and a memory module that include one or more of the wafer level packages, and methods of fabricating the die packages on a wafer level, and integrated circuit modules that include one or more die packages are provided. In one embodiment, the die package comprises a redistribution layer interconnecting two or more dies disposed on a substrate, typically a semiconductor wafer, the redistribution layer including a first trace connecting a bond pad of each of two dies, and a second trace connecting one of the bond pads of the two dies to a ball pad. The die package of the invention can comprise memory devices such as static random access memories (SRAMs), and can be incorporated into a variety of electronic systems as part of memory packages such as single in-line memory modules (SIMMs) or dual in-line memory modules.

31 Claims, 20 Drawing Sheets

U.S. PATENT DOCUMENTS

| | | | | |
|---|---|---|---|---|
| 4,937,203 | A | 6/1990 | Eichelberger et al. | |
| 5,108,825 | A | 4/1992 | Wojnarowski et al. | |
| 5,157,589 | A | 10/1992 | Cole et al. | |
| 5,172,214 | A | 12/1992 | Casto | |
| 5,250,843 | A | 10/1993 | Eichelberger | |
| 5,291,066 | A | 3/1994 | Neugebauer et al. | |
| 5,302,849 | A | 4/1994 | Cavasin | |
| 5,324,687 | A | 6/1994 | Wojnarowski | |
| 5,353,498 | A | 10/1994 | Fillion et al. | |
| 5,366,906 | A | 11/1994 | Wojnarowski et al. | |
| 5,455,459 | A | 10/1995 | Fillion et al. | |
| 5,527,741 | A | 6/1996 | Cole et al. | |
| 5,532,614 | A | 7/1996 | Chiu | |
| 5,731,222 | A | 3/1998 | Malloy et al. | |
| 5,818,102 | A | 10/1998 | Rostoker | |
| 5,841,193 | A | 11/1998 | Eichelberger | |
| 5,851,911 | A | 12/1998 | Farnworth | |
| 5,858,815 | A | 1/1999 | Heo et al. | |
| 5,866,952 | A | 2/1999 | Wojnarowski et al. | |
| 5,903,058 | A | 5/1999 | Akram | |
| 5,910,687 | A | 6/1999 | Chen et al. | |
| 6,025,995 | A | 2/2000 | Marcinkiewicz | |
| 6,046,101 | A | 4/2000 | Dass et al. | |
| 6,121,688 | A | 9/2000 | Akagawa | |
| 6,133,065 | A | 10/2000 | Akram | |
| 6,144,102 | A | 11/2000 | Amagai | |
| 6,214,630 | B1 | 4/2001 | Hsuan et al. | |
| 6,228,548 | B1 | 5/2001 | King | |
| 6,228,684 | B1 | 5/2001 | Maruyama | |
| 6,277,670 | B1 | 8/2001 | You | |
| 6,291,894 | B1 | 9/2001 | Farnworth et al. | |
| 6,300,163 | B1 * | 10/2001 | Akram | 438/108 |
| 6,344,401 | B1 | 2/2002 | Lam | |
| 6,358,833 | B1 | 3/2002 | Akram | |
| 6,396,148 | B1 | 5/2002 | Eichelberger et al. | |
| 6,397,685 | B1 | 6/2002 | Cook et al. | |
| 6,403,448 | B1 | 6/2002 | Reddy | |
| 6,428,641 | B1 | 8/2002 | Yoon et al. | |
| 6,469,356 | B2 | 10/2002 | Kumagai et al. | |
| 6,472,745 | B1 | 10/2002 | Iizuka | |
| 6,479,887 | B1 | 11/2002 | Yoon et al. | |
| 6,486,005 | B1 * | 11/2002 | Kim | 438/118 |
| 6,586,275 | B2 | 7/2003 | Kim et al. | |
| 6,611,052 | B2 * | 8/2003 | Poo et al. | 257/686 |
| 6,627,991 | B1 | 9/2003 | Joshi | |
| 6,656,827 | B1 | 12/2003 | Taso et al. | |
| 6,686,615 | B1 | 2/2004 | Cheng et al. | |
| 6,710,454 | B1 | 3/2004 | Boon | |
| 6,720,212 | B2 | 4/2004 | Robl et al. | |
| 6,727,116 | B2 | 4/2004 | Poo et al. | |
| 6,747,348 | B2 | 6/2004 | Jeung et al. | |
| 6,750,547 | B2 * | 6/2004 | Jeung et al. | 257/778 |
| 6,759,311 | B2 * | 7/2004 | Eldridge et al. | 438/460 |
| 6,762,431 | B2 | 7/2004 | Maruyama | |
| 6,828,174 | B2 * | 12/2004 | Katagiri et al. | 438/107 |
| 6,867,502 | B2 | 3/2005 | Katagiri et al. | |
| 6,885,101 | B2 | 4/2005 | Storli | |
| 6,894,399 | B2 | 5/2005 | Vu et al. | |
| 6,909,184 | B2 | 6/2005 | Ushijima et al. | |
| 7,071,487 | B2 | 7/2006 | Maruyama | |
| 7,274,097 | B2 * | 9/2007 | Baek et al. | 257/686 |
| 7,368,374 | B2 * | 5/2008 | Chia et al. | 438/613 |
| 7,399,990 | B2 | 7/2008 | Maruyama | |
| 7,485,955 | B2 | 2/2009 | Kang et al. | |
| 7,557,437 | B2 | 7/2009 | Yang et al. | |
| 7,579,681 | B2 * | 8/2009 | Chia et al. | 257/685 |
| 7,595,222 | B2 | 9/2009 | Shimoishizaka et al. | |
| 7,635,611 | B2 | 12/2009 | Jiang | |
| 7,642,551 | B2 | 1/2010 | Maruyama | |
| 7,741,151 | B2 | 6/2010 | Amrine et al. | |
| 7,884,007 | B2 * | 2/2011 | Chia et al. | 438/613 |
| 7,923,295 | B2 | 4/2011 | Shim et al. | |
| 2001/0033031 | A1 | 10/2001 | Shibata | |
| 2001/0042901 | A1 * | 11/2001 | Maruyama | 257/620 |
| 2001/0046168 | A1 | 11/2001 | Barth et al. | |
| 2002/0038890 | A1 | 4/2002 | Ohuchi | |
| 2002/0047210 | A1 | 4/2002 | Yamada et al. | |
| 2002/0093088 | A1 | 7/2002 | Wang | |
| 2002/0177294 | A1 | 11/2002 | Otaki et al. | |
| 2002/0190336 | A1 | 12/2002 | Shimizu et al. | |
| 2003/0116861 | A1 * | 6/2003 | Jeung et al. | 257/778 |
| 2003/0122246 | A1 | 7/2003 | Lin et al. | |
| 2004/0166662 | A1 | 8/2004 | Lei | |
| 2004/0183213 | A1 | 9/2004 | Hsu et al. | |
| 2005/0029668 | A1 * | 2/2005 | Poo et al. | 257/773 |
| 2005/0048695 | A1 * | 3/2005 | Chia et al. | 438/106 |
| 2005/0056945 | A1 | 3/2005 | Lunde et al. | |
| 2005/0095750 | A1 | 5/2005 | Lo et al. | |
| 2005/0218473 | A1 | 10/2005 | Wakisaka | |
| 2005/0245061 | A1 | 11/2005 | Satoh et al. | |
| 2007/0105346 | A1 | 5/2007 | Beroz et al. | |
| 2007/0128835 | A1 | 6/2007 | Yang et al. | |
| 2007/0145458 | A1 | 6/2007 | Asami | |
| 2007/0152327 | A1 * | 7/2007 | Chia et al. | 257/723 |
| 2007/0264751 | A1 * | 11/2007 | Chia et al. | 438/106 |
| 2008/0054423 | A1 * | 3/2008 | Poo et al. | 257/676 |

FOREIGN PATENT DOCUMENTS

| | | |
|---|---|---|
| JP | 408162456 | 6/1996 |
| JP | 363312648 | 12/1998 |

* cited by examiner

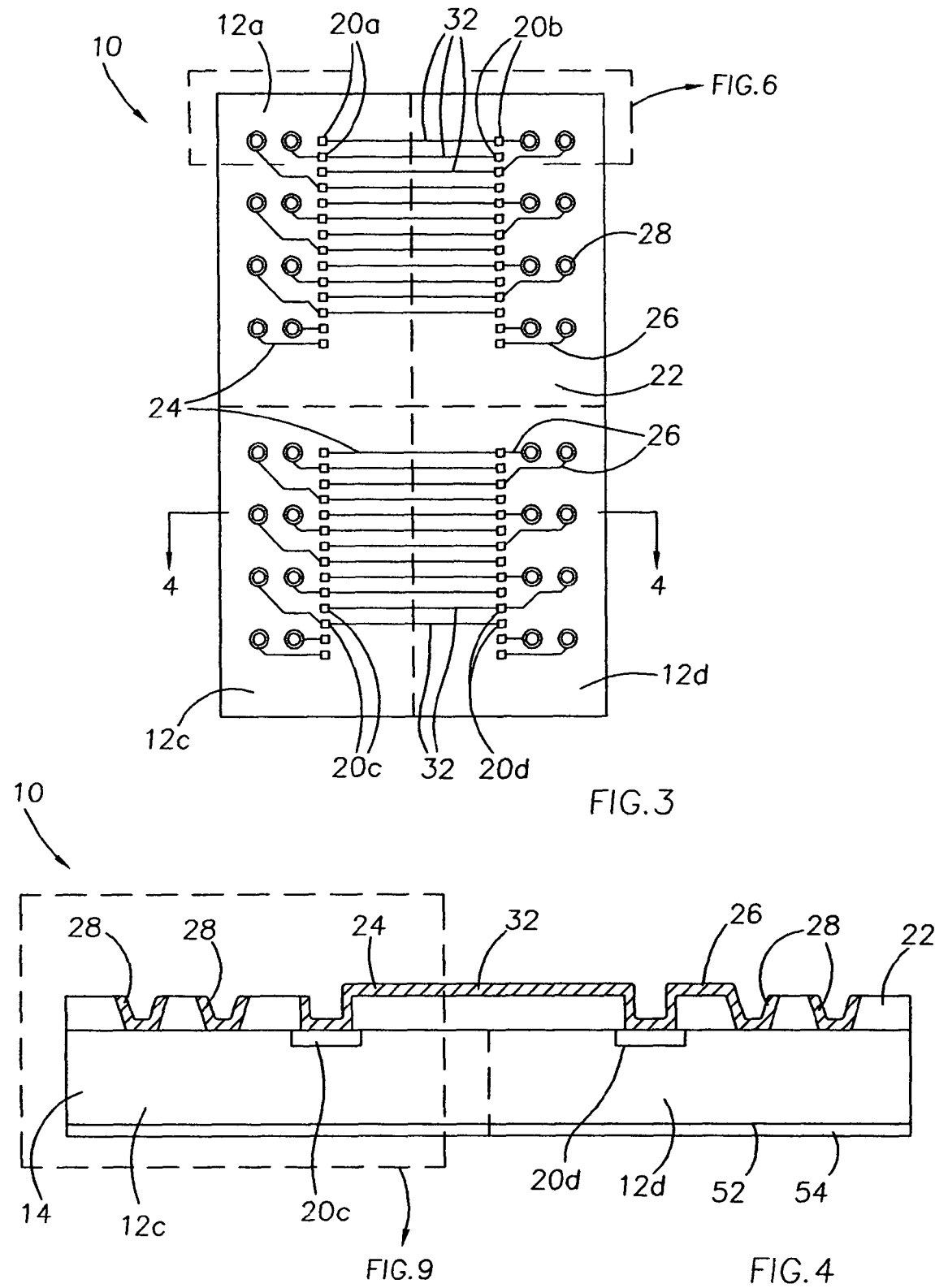

SUPER HIGH-DENSITY MODULE WITH INTEGRATED WAFER LEVEL PACKAGES

CROSS-REFERENCE TO RELATED APPLICATION

This application is a divisional of U.S. patent application Ser. No. 10/167,284, filed Jun. 11, 2002, now U.S. Pat. No. 7,579,681, issued Aug. 25, 2009, whichclaims priority to Singapore Patent Application No. 200203050-0, filed May 21, 2002.

FIELD OF THE INVENTION

This invention relates generally to integrated circuit chip packages, and more specifically to a method of forming an integrated circuit package at a wafer level.

BACKGROUND OF THE INVENTION

With the increase in memory needed by software, the trend in state-of-the-art microprocessors is toward higher performance, high-density memory modules, such as single in-line memory modules (SIMMs) or dual in-line memory modules (DIMMs), which are circuit cards with memory chips attached. Having higher capacity memory chip units or packing more memory chip units on a memory module is one way to increase memory density on a module.

Conventional methods of mounting multiple die units on a module is through stacking the die units or attaching a daughter board to the main module board. However, a profusion of small electronic products such as pagers and cellular telephones demand small product size and low profile products. The demand by consumers for miniature electronic devices has increased the need for powerful yet compact, ultra-thin semiconductor devices.

Based on these and other needs and deficiencies, an improved die package for achieving a high-density memory module would be desirable.

SUMMARY OF THE INVENTION

The present invention provides a wafer level semiconductor die package, a semiconductor wafer comprising one or more wafer level packages, an electronic system comprising an integrated circuit module that includes one or more of the wafer level packages, a memory module comprising a printed circuit board and an integrated circuit module that includes at least one of the wafer level packages, and methods of fabricating the die packages on a wafer level, and integrated circuit modules that include one or more packages.

In one aspect, the invention provides a die package. In one embodiment, the die package comprises a redistribution layer interconnecting two or more dies disposed on a substrate, typically a semiconductor wafer, the redistribution layer comprising a first trace connecting a bond pad of each of two dies, and a second trace connecting one of the bond pads of the two dies to a ball pad. The die package can further include an insulating layer disposed over the traces, and/or a ball contact mounted on the ball pad.

In another embodiment, the die package is an integrated wafer level package comprising a plurality of electrically conductive traces disposed on an insulating film overlying two or more dies disposed on a semiconductor wafer or other substrate, each die comprising one or more bond pads, and each of the bond pads exposed through an opening in the insulating film; a redistribution layer comprising a plurality of traces and ball pads disposed on the insulating film, and a first trace of the redistribution layer interconnecting a bond pad of a first die to the bond pad of a second die, and a second trace connecting one of the bond pads to a ball pad disposed on the insulating film. Thus, a trace connects each bond pad of the dies to either a ball pad or to the bond pad of another die which bond pad is connected by a trace to a ball pad.

In another embodiment, the die package comprises an integrated wafer level package, comprising a support substrate, typically a semiconductor wafer, comprising at least three semiconductor dies, each die comprising a plurality of bond pads; an insulating film disposed over the dies with openings exposing the plurality of bond pads of the dies; a plurality of traces and ball pads disposed on the insulating film; a bond pad of each of a first die and second die interconnected by a trace, and one of the plurality of bond pads of the first and second dies connected by a trace to a ball pad; an insulating layer disposed over the plurality of traces; and a plurality of traces disposed on the insulating layer, including a trace connecting a bond pad of either the first die or the second die to a bond pad of a third die.

In yet another embodiment, the die package comprises an integrated wafer level package, comprising a semiconductor wafer or other support substrate comprising three or more semiconductor dies, each die comprising one or more bond pads, and a first redistribution layer including a trace interconnecting a bond pad of each of a first die and a second die; an insulating layer disposed over the first redistribution layer and comprising openings exposing the one or more bond pads of the dies; and a second redistribution layer comprising a plurality of traces disposed on the insulating layer, including a trace interconnecting a bond pad of either the first die or the second die to a bond pad of a third die; wherein one of the one or more bond pads of the first, second or third dies is connected by a trace to a ball pad within the package. The first redistribution layer can be disposed on an insulating film overlying the dies. The ball pad can be part of the first redistribution layer and connected by a trace to one of the bond pads of the first and second dies, or part of the second redistribution layer with a trace of the second redistribution layer connecting the bond pad of any of the first, second or third dies to the ball pad.

In yet another embodiment, the die package comprises an integrated wafer level package, comprising a semiconductor wafer or other support substrate comprising two or more dies, each die comprising a plurality of bond pads; an insulating film disposed over the dies, the insulating film comprising openings aligned with and exposing the plurality of bond pads of the dies; a first redistribution layer disposed on the insulating film and including a first trace interconnecting a bond pad of each of a first die and a second die; a first insulating layer disposed over the first redistribution layer and comprising openings exposing at least one of the first traces; a second insulating layer disposed over the first insulating layer and comprising openings exposing the first trace(s) and openings for ball pads; and a second redistribution layer comprising a ball pad and a second trace disposed on the second insulating layer, and a via interconnect disposed in the openings onto the first trace, the second trace connecting the via interconnect to the ball pad.

In another aspect, the invention provides a semiconductor wafer. In various embodiments, the wafer comprises one or more wafer level packages according to the invention.

In another aspect, the invention provides an electronic system comprising an integrated circuit module comprising at least one wafer level package according to the invention. In one embodiment the integrated circuit module comprises a multi-chip module, such as a DIMM board, among others.

In yet another aspect, the invention provides a memory module comprising a printed circuit board and an integrated circuit module comprising at least one wafer level package according to the invention. In one embodiment, the memory module can comprise an integrated circuit module in the form of a DIMM board or other multi-chip module.

In a further aspect, the invention provides methods of fabricating the foregoing die packages on a wafer level. In an embodiment of a method of fabricating a die package on a wafer level, the method comprises forming a redistribution layer over at least two dies disposed on a semiconductor wafer or other support substrate, the redistribution layer comprising a plurality of traces and one or more ball pads including a trace connecting a bond pad of each of a first and second die, and a trace connecting one of the bond pads to a ball pad.

In another embodiment of a method of fabricating a wafer level die package, the method comprises providing a substrate having a plurality of semiconductor dies formed thereon, each die comprising one or more bond pads; applying an insulating film over the substrate; forming openings through the insulating film to the bond pads of the plurality of semiconductor dies; and forming a redistribution layer over the insulating film, the redistribution layer comprising a plurality of traces and ball pads, including a trace interconnecting a bond pad of each of a first die and a second die, and a trace connecting one of the bond pads of the first and second dies to a ball pad. The method can further include steps of applying an insulating layer over the redistribution layer and forming openings through the insulating layer to the ball pads, and mounting a ball contact on each of the ball pads. In another embodiment, the insulating layer can be applied over the redistribution layer and openings formed to the bond pads and ball pads, and a second redistribution comprising a plurality of traces can be formed over the insulating layer, including a trace interconnecting a bond pad of either the first die or the second die to a bond pad of a third die.

In yet another embodiment of a method of fabricating a die package on a wafer level, the method comprises forming a first redistribution layer over a plurality of dies disposed on a semiconductor wafer or other substrate, including a trace interconnecting a bond pad of each of a first die and a second die; applying an insulating layer over the traces that includes openings to the bond pads of the plurality of dies; and forming a second redistribution layer comprising a plurality of traces and ball pads over the insulating layer, including a trace interconnecting a bond pad of either the first or the second die to a bond pad of a third die; wherein a trace of either the first or second redistribution layers connects one of the bond pads of the first, second or third dies to a ball pad. The ball pad can be provided as part of the first redistribution layer formed on an insulating film overlying the plurality of dies whereby the ball pad is connected by a trace to one of the interconnected bond pads of the first or second dies. In another embodiment, the ball pad can be provided as part of the second redistribution layer, connected by a trace to one of the interconnected bond pads of the first, second or third dies.

In yet another embodiment of a method of fabricating a die package on a wafer level, the method comprises forming a first redistribution layer over at least two dies disposed on a substrate, the first redistribution layer (RDL) comprising a plurality of traces including a trace connecting a bond pad of each of the two dies; forming an insulating layer over the first redistribution layer; forming openings through the insulating layer to expose each of the traces of the first redistribution layer; and forming a second redistribution layer over the insulating layer, the second redistribution layer comprising a plurality of ball pads and traces, and a via interconnect disposed in each of the openings of the insulating layer in contact with the trace of the first RDL, the trace of the second RDL connecting the via interconnect to at least one ball pad. The method can further comprise the steps of forming an insulating layer over the second redistribution layer; forming openings to expose the ball pads; and connecting ball contacts to the ball pads of the second redistribution layer; and further singulating the wafer to form individual packages, each package comprising the first and second dies connected by the traces of the first redistribution layer.

In another aspect, the invention provides methods for fabricating an integrated circuit module. In one embodiment, the method comprises the steps of providing a substrate comprising a plurality of wafer level packages according to the invention; separating each package of the plurality on the substrate to form individual packages; and assembling one or more packages into an integrated circuit module, for example, a multi-chip module such as a DIMM board.

The present invention provides a multiple die package having an exceptionally high memory capacity with a low profile. The die package achieves a single unit (die package) having an increased memory capacity using current memory chips by virtue of the interconnections between two or more chips within the die package, without having to wait for the availability of the next higher density chip. The integrated wafer package also has the advantage of space saving on a module board due to the compact and thin profile, which, in turn, allows more integrated units/packages and higher memory capacity on a flip-chip memory module such as a SIMM or DIMM board. The die package also provides superior signal integrity.

The configuration of the RDL with traces connecting bond pads of two or more dies together and routing the connection to a single ball pad also eliminates the need for a separate pin or ball contact for each individual bond pad, resulting in a lower pin count compared to other memory module chip units. The package also is easier to lay out on a DIMM board or or other memory module since part of the routing is done on a wafer level.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIG. 3 is a plan view of the wafer level package of FIG. 2, without an insulating layer.

FIG. 4 is a cross-sectional, side elevational view of the wafer level package of FIGS. 2 and 3, taken along line 4-4.

FIG. 12 is a plan view of a processing step in which an insulating layer, shown as partially cut away, is applied over the RDL of the wafer level package depicted in FIG. 3, and openings are formed to the bond pads and ball pads.

FIG. 13 is a cross-sectional, side elevational view of the wafer level package of FIG. 12, taken along line 13-13.

FIG. 14 is a plan view of a subsequent processing step of a wafer level package in which a second redistribution layer (RDL) is fabricated on the insulating layer, shown as partially cut away.

FIG. 15 is a cross-sectional, side elevational view of the wafer level package of FIG. 14, taken along line 15-15.

FIG. 16 is a plan view of a subsequent processing step in which an insulating layer is applied over the second RDL of the wafer level package depicted in FIG. 14, with ball contacts mounted on the ball pads of the dies.

FIG. 17 is a cross-sectional, side elevational view of the wafer level package of FIG. 16, taken along line 17-17.

FIG. 19 is a plan view of a processing step in which a redistribution layer (RDL) is formed to connect bond pads of the dies of the wafer level package.

FIG. 20 is a cross-sectional, side elevational view of the wafer level package of FIG. 19, taken along line 20-20.

FIG. 21 is a plan view of a subsequent processing step in which an insulating layer, shown as partially cut away, is applied over the RDL of the wafer level package depicted in FIG. 19, and openings are formed to the bond pads of the dies.

FIG. 22 is a cross-sectional, side elevational view of the wafer level package of FIG. 21, taken along line 22-22.

FIG. 23 is a plan view of a subsequent processing step in which a second redistribution layer (RDL) is fabricated on the insulating layer, shown as partially cut away.

FIG. 24 is a cross-sectional, side elevational view of the wafer level package of FIG. 23, taken along line 24-24.

FIG. 25 is a partial view of the package of FIG. 23, showing a schematic depiction of trace connections of bond pads of the dies, with traces of the first RDL shown as broken lines.

FIG. 26 is a plan view of a subsequent processing step in which an insulating layer is applied over the second RDL of the wafer level package depicted in FIG. 24, with ball contacts mounted on the ball pads of the dies.

FIG. 27 is a cross-sectional, side elevational view of the wafer level package of FIG. 26, taken along line 27-27.

FIG. 28 is a plan view of a processing step in which a first redistribution layer (RDL) is formed to connect bond pads of the dies of the wafer level package.

FIG. 29 is a cross-sectional, side elevational view of the wafer level package of FIG. 28, taken along line 29-29.

FIG. 30 is a plan view of a subsequent processing step in which a first insulating layer, shown as partially cut away, is applied over the first RDL of the wafer level package depicted in FIG. 28, and openings are formed to interconnecting traces.

FIG. 31 is a cross-sectional, side elevational view of the wafer level package of FIG. 30, taken along line 31-31.

FIG. 32 is a plan view of a subsequent processing step in which a second insulating layer, shown as partially cut away, is applied over the first insulating layer of the wafer level package depicted in FIG. 30, with openings formed to the interconnecting traces, and a second redistribution layer (RDL) is fabricated on the second insulating layer to provide via interconnects to the interconnecting traces within the openings, and ball pads and traces connecting the via interconnects to the ball pads.

FIG. 33 is a cross-sectional, side elevational view of the wafer level package of FIG. 32, taken along line 33-33.

FIG. 34 is a cross-sectional, side elevational view of the wafer level package of FIG. 32, taken along line 34-34.

FIG. 35 is a plan view of a subsequent processing step in which an insulating layer, shown as partially cut away, is applied over the second RDL of the wafer level package depicted in FIG. 32, with openings formed to the ball pads, and ball contacts mounted on the ball pads of the dies.

FIG. 36 is a cross-sectional, side elevational view of the wafer level package of FIG. 35, taken along line 36-36.

DETAILED DESCRIPTION OF THE PREFERRED EMBODIMENT

Figure 1:
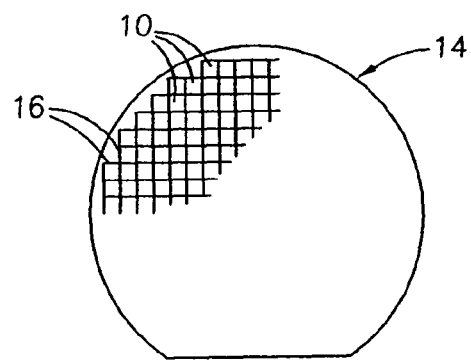
FIG. 1 is a plan view of a substrate containing wafer level packages according to the invention.

The invention will be described generally with reference to the drawings for the purpose of illustrating embodiments only and not for purposes of limiting the same. The figures illustrate processing steps for use in fabricating semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

The present invention provides a semiconductor die package comprising two or more dies that can be fabricated at the wafer level, that is, an entire wafer of active device dies can be processed according to the invention to form one or more die packages, and burn-in and testing of the one or more packages can be performed before the wafer is separated into individual packages. It is also contemplated that packages can be defined as comprising, multiple, unseparated packages containing two or more dies, or whole or partial wafers.

Referring to FIGS. 1-4, a first embodiment of an integrated wafer level package 10 according to the invention is depicted. The wafer level package 10 comprises two or more semiconductor dies. For illustrative purposes, each package 10 includes four dies 12a-12d (delineated by the dashed lines), which is merely exemplary.

The dies 12a-12d are fabricated on a surface of a substrate 14, typically a semiconductor wafer, through etching, deposition, or other well known techniques, and contain integrated circuitry comprising active devices to perform a specific memory function. A dynamic random access memory circuit is exemplary of such an integrated circuit, although other circuits for any function, such as processors, can be packaged according to the invention. Scribe lines 16 are typically provided between the wafer level packages 10. The active surface 18 of the dies 12a-12d includes a series of bond pads 20a-20d in electrical communication with the integrated circuits contained within each die 12a-12d. In the illustrated example, the bond pads 20a-20d are in a linear pattern in a longitudinal arrangement on each of the dies 12a-12d, although other bond pad arrangements can be utilized. A passivation or insulating (dielectric) film 22 has been formed over the surface of the substrate 14 to passivate the active surface of the dies and to seal the device structures of the dies from contamination and moisture, and as a scratch protection layer. Openings formed in the insulating film 22 align with and expose the bond pads 20a-20d of the dies 12a-12d.

The wafer level package 10 further includes a redistribution layer (RDL) 24 formed on the insulating film 22. The RDL 24 includes electrically conductive traces 26 that connect the bond pads 20a-20d of the dies 12a-12d to ball pads 28 for attaching external ball contacts 30 such as solder balls.

Figure 5:
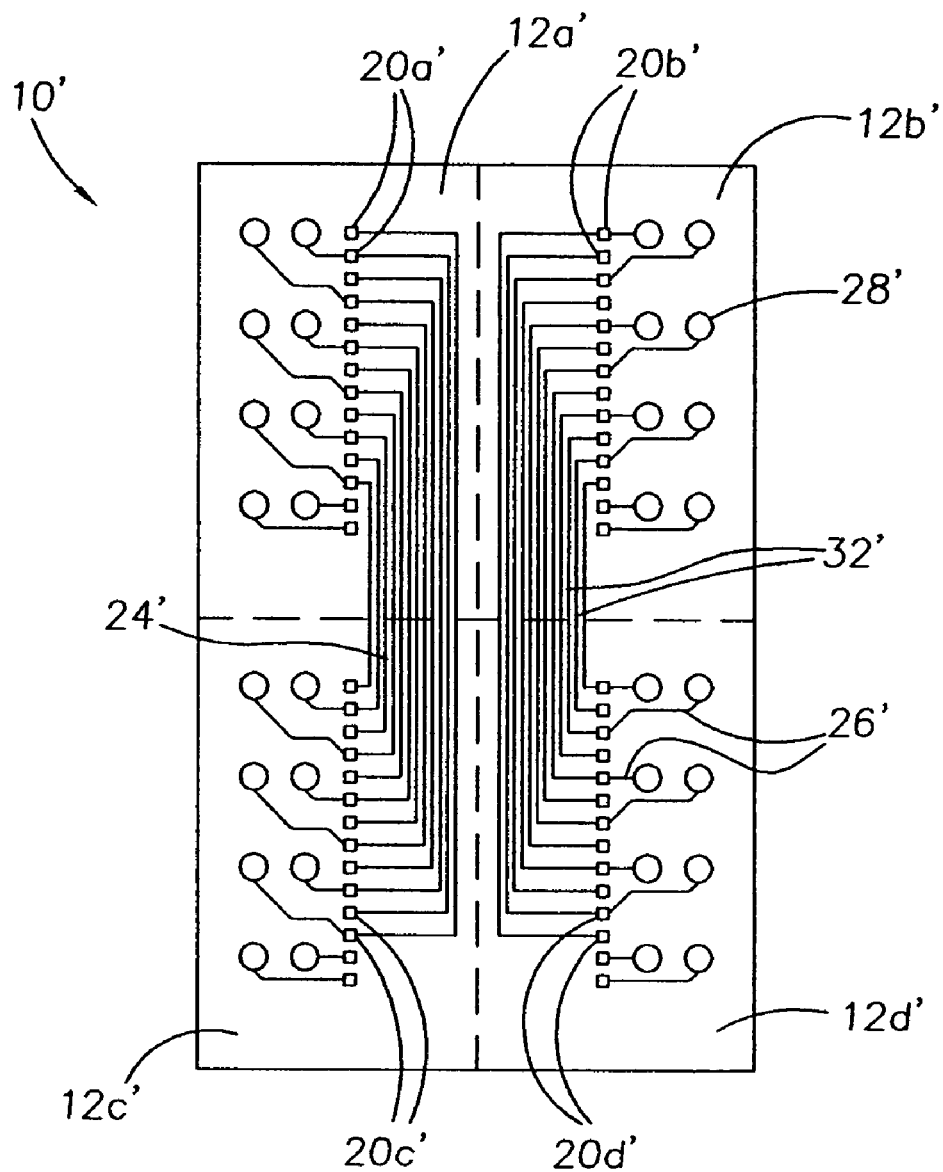
FIG. 5 is a plan view of another embodiment of a wafer level package according to the invention.

According to the invention, the RDL 24 of the wafer level package 10 also includes traces 32 that interconnect the bond pads of two or more of the dies within the wafer level package 10. For example, as illustrated in FIG. 3, in the embodiment of the wafer level package 10, the traces 32 of the RDL 24 are formed to interconnect the bond pads 20a of a first die 12a to the bond pads 20b of a second die 12b, and the bond pads 20c of a third die 12c to the bond pads 20d of a fourth die 12d. Referring to FIG. 5, in another embodiment of a wafer level package 10' according to the invention, the traces 32' of the RDL 24' are patterned to interconnect the bond pads 20a' of a first die 12a' with the bond pads 20c' of a third die 12c', and the bond pads 20b' of a second die 12b' with the bond pads 20d' of a fourth die 12d'. The illustrated trace interconnections are merely exemplary, and other configurations of the interconnections of traces 32 can be utilized to interconnect the bond pads of the dies to each other and to the ball pads within the wafer level package.

Figure 6:
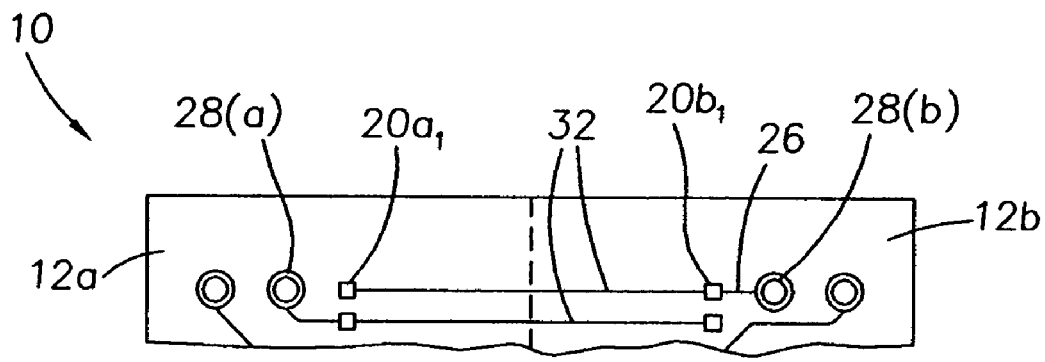
FIG. 6 is a partial view of the wafer level package of FIG. 3, showing a portion of the redistribution layer.

Each bond pad of a die within the wafer level package is connected to a ball pad 28 either directly through a trace 26, or indirectly through the interconnecting trace 32 leading to the bond pad of the adjoining die, which is then connected through the trace 26 to the ball pad 28. For example, referring to FIG. 6, the bond pad $20b_1$ of die 12b is directly connected to the ball pad 28(b) via the trace 26. As further shown, the bond pad $20a_1$ of die 12a is also connected to the same ball pad 28(b) indirectly through the interconnecting trace 32 and the trace 26 leading from the bond pad $20b_1$ of die 12b.

Figure 2:
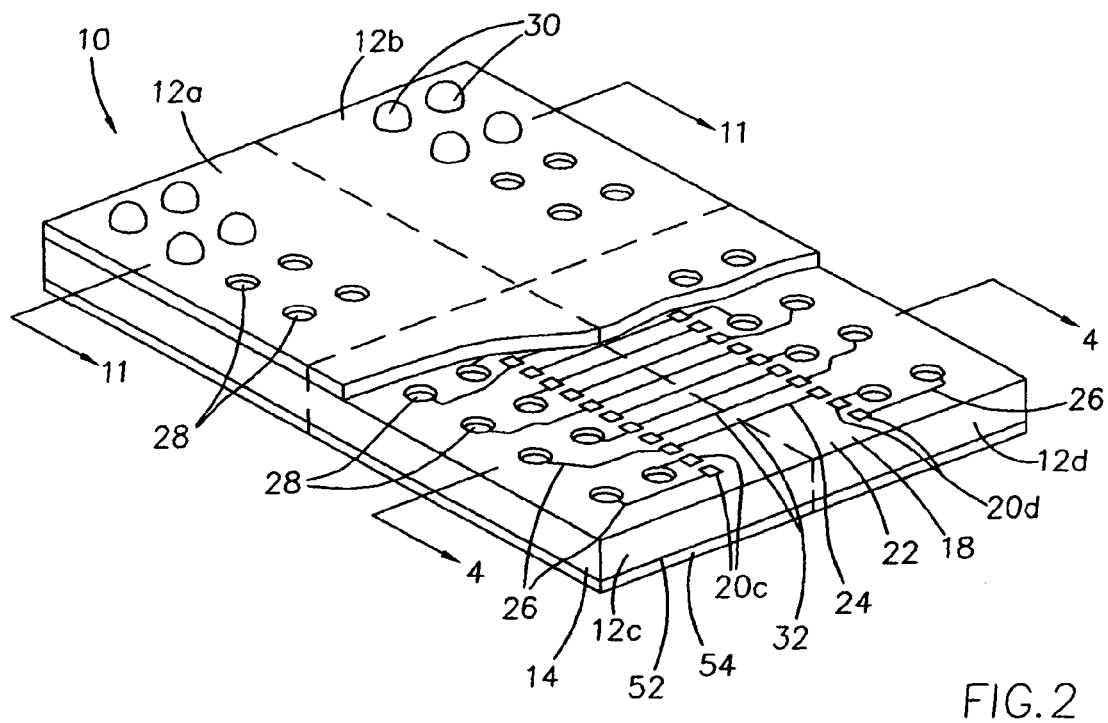
FIG. 2 is a perspective view of an embodiment of a wafer level package according to the invention, showing an insulating layer partially cut away to expose a redistribution layer.
Figure 7:
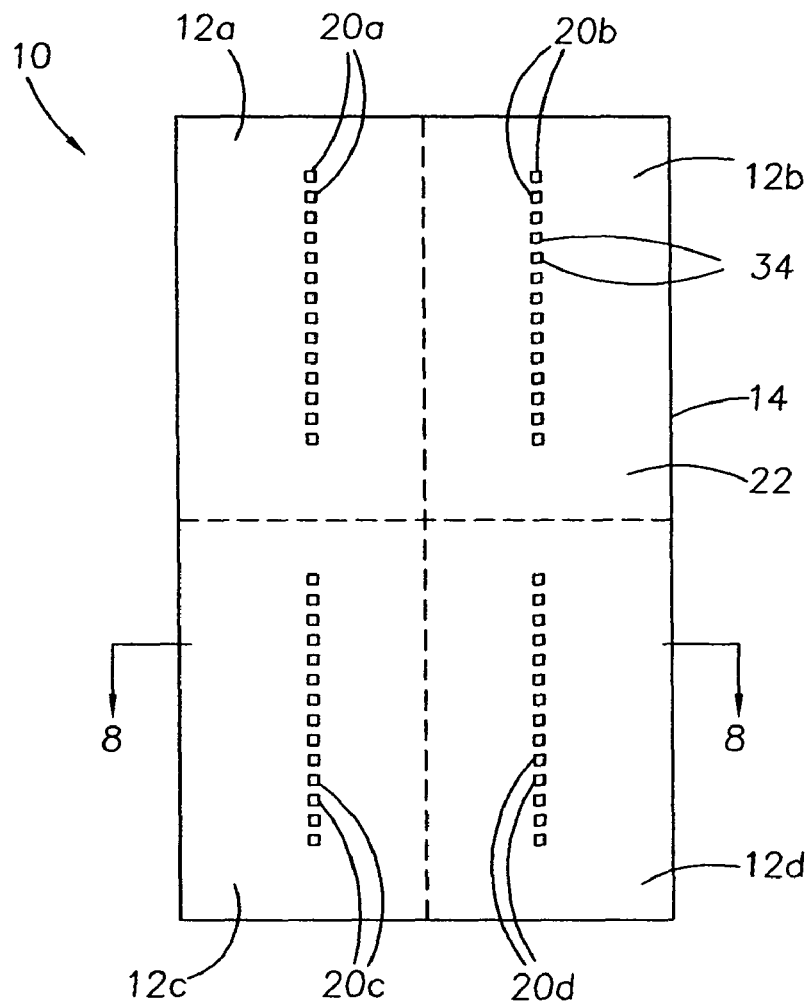
FIG. 7 is a plan view of a processing step in the fabrication of the wafer level package of FIG. 2, according to an embodiment of a method of the invention showing the bond pads exposed through openings in the insulating film.

Referring now to FIG. 7, a processing step is illustrated in an embodiment of a method for forming the wafer level package 10 of FIG. 2, which comprises four dies 12a-12d. The semiconductor dies 12a-12d are formed on a semiconductor wafer or other substrate 14, through etching, deposition, or other well known techniques in the art, and respectively include bond pads 20a-20d. The bond pads 20a-20d typically comprise a conductive metal or metal alloy such as aluminum, aluminum alloy, titanium, tungsten, titanium-tungsten alloy, tantalum, platinum, copper, or a refractory metal silicide, for example, and are electrically connected to the die circuitry.

Figure 8:
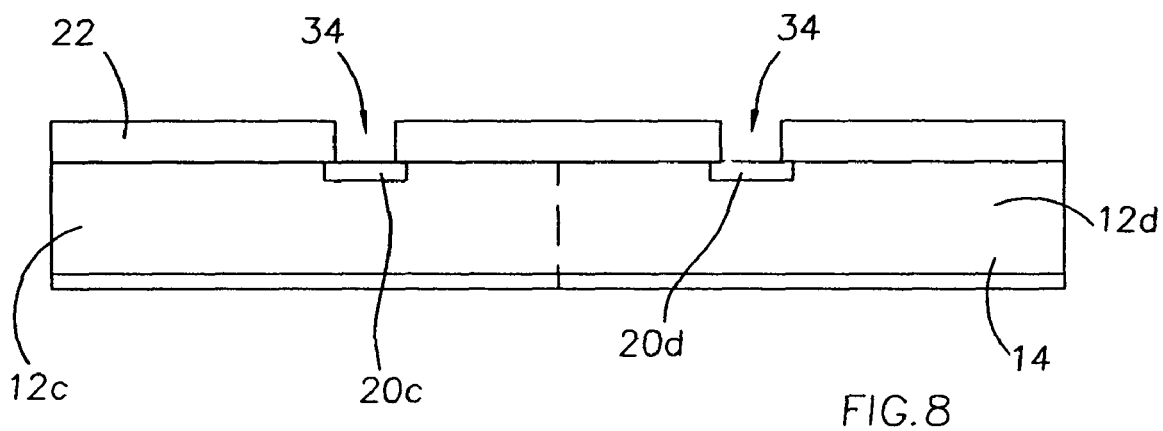
FIG. 8 is a cross-sectional view of the package of FIG. 7, taken along line 8-8.

As also shown in FIG. 8, an insulating film 22 can be formed over the surface of the substrate 14 to passivate the active surface of the dies, as known in the art, typically by oxidizing or nitriding to form a silicon dioxide or silicon nitride layer or a combination of the two. The insulating film 22 can also be formed of a dielectric material such as polyimide or another non-conductive elastomer, a photoimageable polymer such as benzocyclobutene (BCB), or a spin on glass (SOG) such as phosphosilicate glass (PSG), borosilicate glass (BSG) and borophosphosilicate glass (BPSG), among other insulating materials. The material can be applied using conventional methods including deposition techniques, spin-coating, spraying, flow coating, brush coating, among other application techniques. The insulating film 22 can be masked and etched by conventional methods to form openings 34 that align with and expose the bond pads 20a-20d of the dies 12a-12d.

As illustrated in FIGS. 3-4, a redistribution layer (RDL) 24 is formed on the insulating film 22, which includes traces 26, ball pads 28, and interconnecting traces 32.

The present invention utilizes a conductive redistribution wafer level package technology on two or more chips whereby, instead of the redistribution traces confined to a single chip (unit), the routing traces are extended to one or more adjacent chips (units) with all common signal buses being tied together. The structure of the redistribution layer to interconnect two or more dies within a package increases the memory capacity of the die package. For example, where redistribution traces interconnect two die units, the memory capacity of the combined units is double. This capacity can be extended to additional multiple units, for example, four units, eight units, sixteen units, and so on. The present invention thus results in an increase in the capacity of a singulated unit or die package as a wafer scale (level) package. Further, since address, data and some control buses or even power/ground pins for memory devices are shared, the number of pin-out/contact balls for the integrated package is reduced compared to single die units.

The RDL 24 typically comprises a highly conductive metal or metal alloy such as copper, aluminum, gold, and nickel, for example, or a conductive polymer material. The RDL 24 can be formed using known techniques in the art such as chemical vapor deposition (CVD), plasma enhanced chemical vapor deposition (PECVD), physical vapor deposition (PVD) (sputtering or evaporation), electroplating, electroless plating, stenciling, and screen printing, for example. The RDL 24 can comprise, for example, a foil tape of copper, aluminum or other suitable metal, that can be stamp-cut to provide the desired pattern of traces and ball pads.

Figure 9:
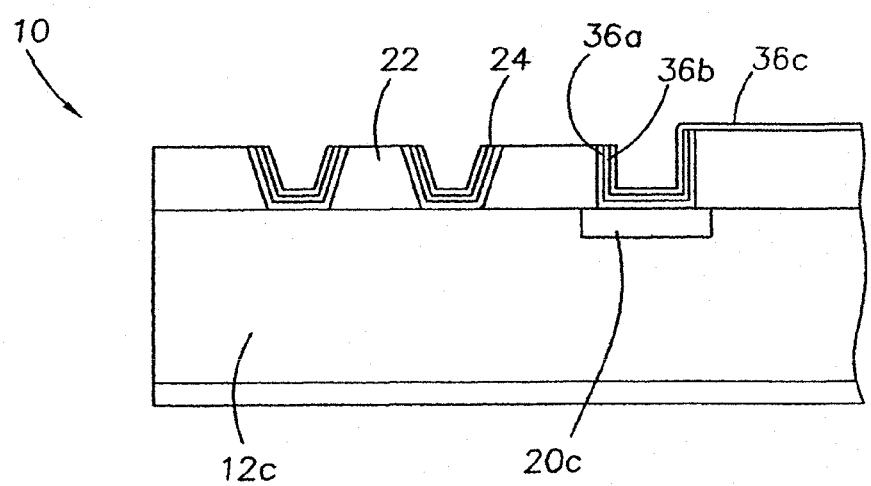
FIG. 9 is a partial cross-sectional view of the wafer level package of FIG. 4, showing an embodiment of a multi-layered RDL.

The RDL can also comprise a multiple metal layers applied over the insulating film 22 according to known techniques, to form a sandwich or multi-layer under-bump metallurgy (UBM) structure, typically having a tri-metal layer structure. As depicted in FIG. 9, for example, the multiple metal layer RDL 24 can comprise overlying layers 36a-36c of a conductive material such as overlying layers of aluminum, nickel, and copper, or overlying layers of chromium, chromium/copper, and copper, for example. Ideally, in utilizing a tri-metal layer structure, the third metal layer 36c is extended to route traces over adjacent units.

Figure 10:
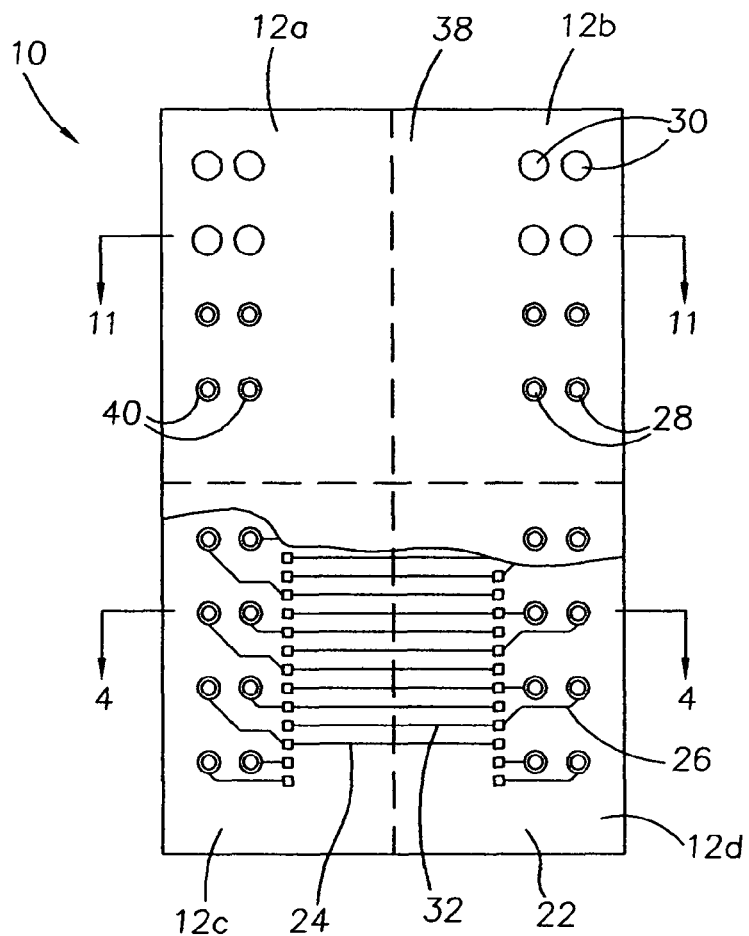
FIG. 10 is a plan view of a processing step in the fabrication of the wafer level package of FIG. 2, in which an insulating layer, shown as partially cut away, is applied over the RDL layer, and ball contacts are mounted on the ball pads.
Figure 11:
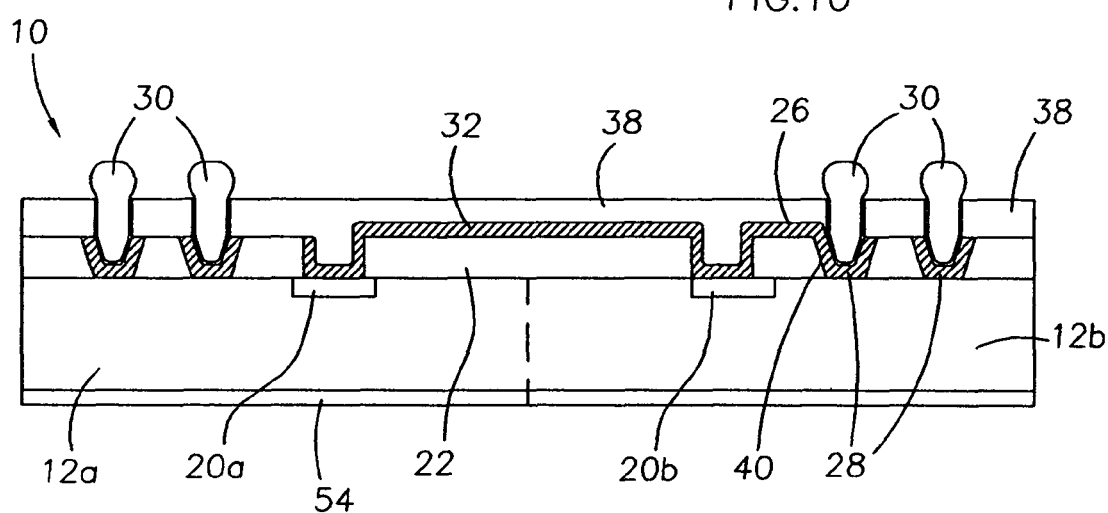
FIG. 11 is a cross-sectional view of the package of FIG. 10, taken along line 11-11.

As shown in FIGS. 10-11, an insulating layer 38 is then applied over the RDL 24 to form a passive exterior layer over the traces 26, 32. The insulating layer 38 can comprise, for example, a polymeric material such as polyimide or another non-conductive elastomer, or a photoimageable polymer such as benzocyclobutene (BCB). The material can be applied using conventional methods, and the insulating layer 38 can be patterned and etched according to known techniques to provide openings 40 that align with and expose the ball pads 28.

A plurality of ball contacts 30 are attached to the ball pads 28 for connecting the wafer level package 10 as a component to an external circuit board, motherboard or other electrical apparatus or device. Exemplary ball contacts 30 comprise solder typically comprising tin (Sn) and/or lead (Pb), or a conductive material such as a conductive epoxy or conductor-filled epoxy. Solder ball contacts 30 can be formed using conventional processes such as stenciling, screen printing, electroplating, electroless plating, evaporation, and the like. Conductive polymer material can be applied and cured to form the ball contacts 30.

The wafer 14 can then singulated along scribe lines 16 into individual packages 10, each of which includes at least two dies, and shown as four interconnected dies 12a-12d in the illustrated example.

Figure 12:
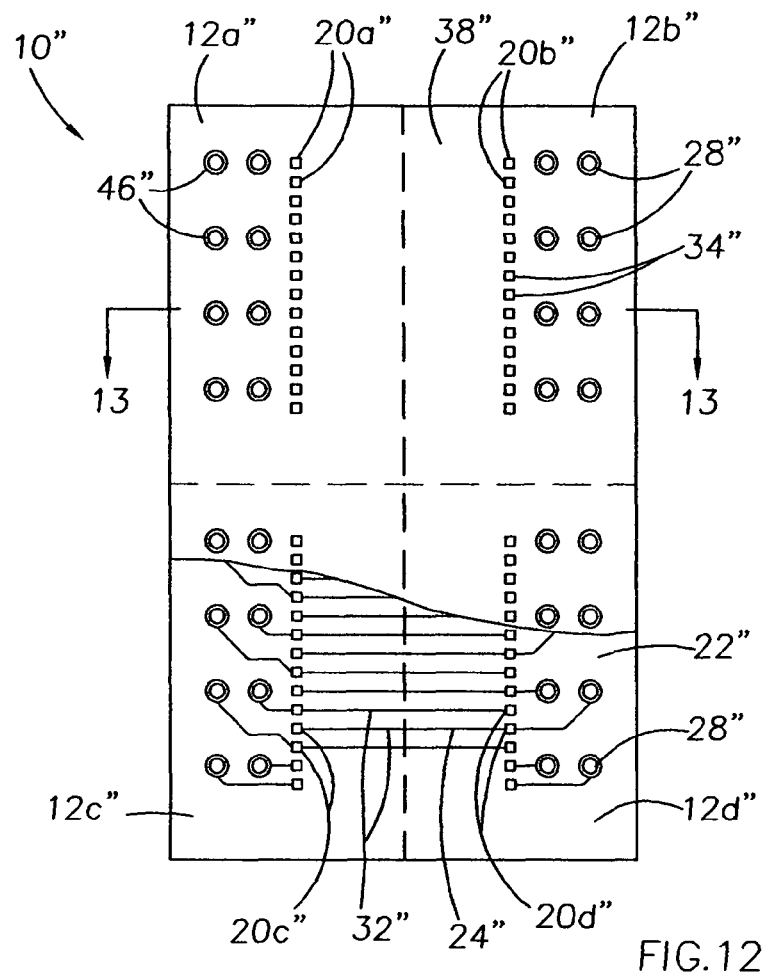
FIGS. 12-17 illustrate sequential processing steps in the fabrication of another embodiment of a wafer level package according to the invention.
Figure 13:
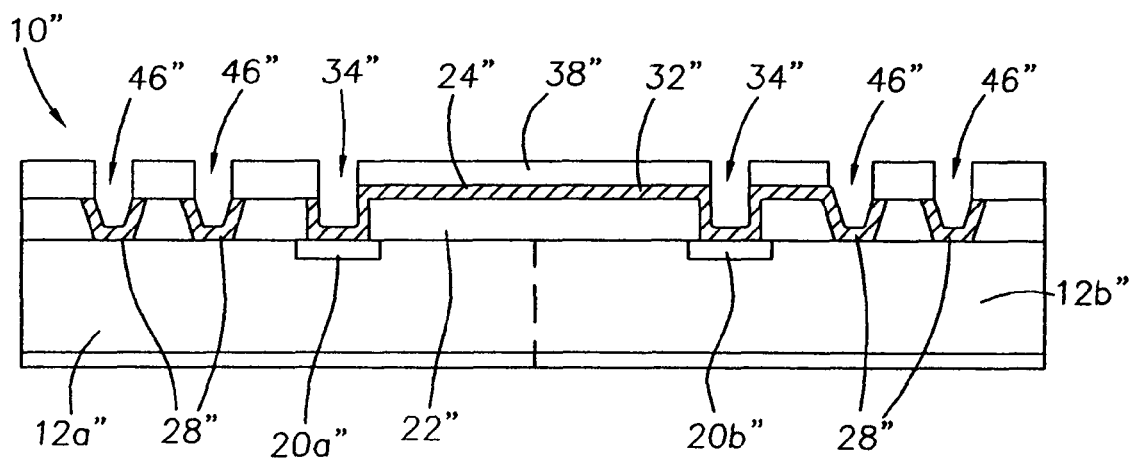
Figure 14:
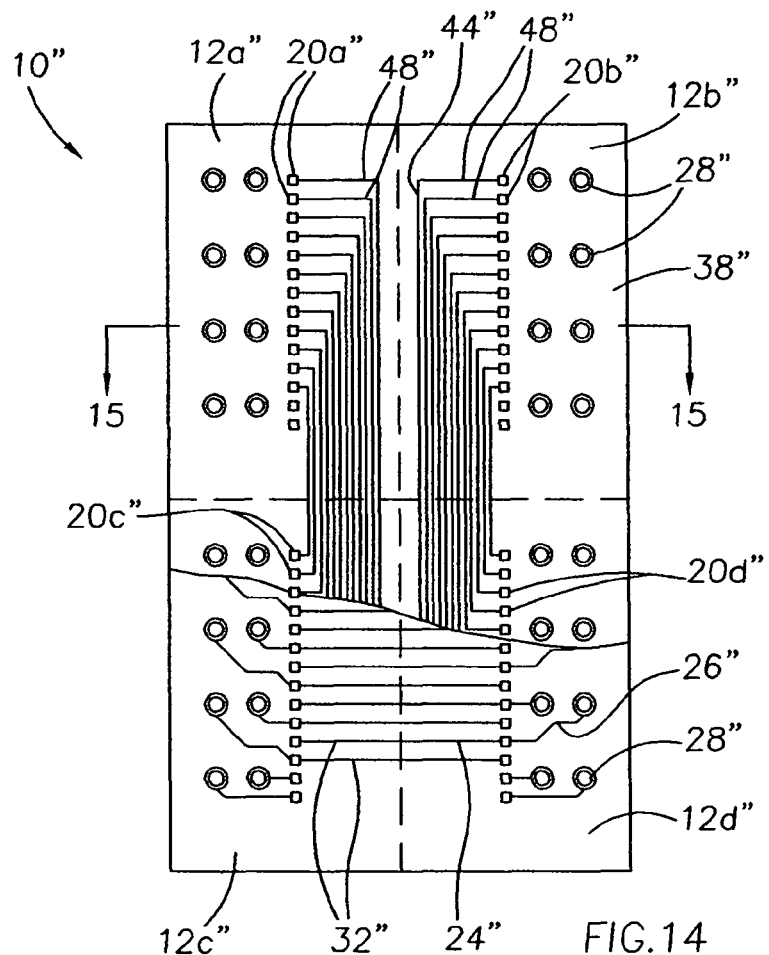
Figure 15:
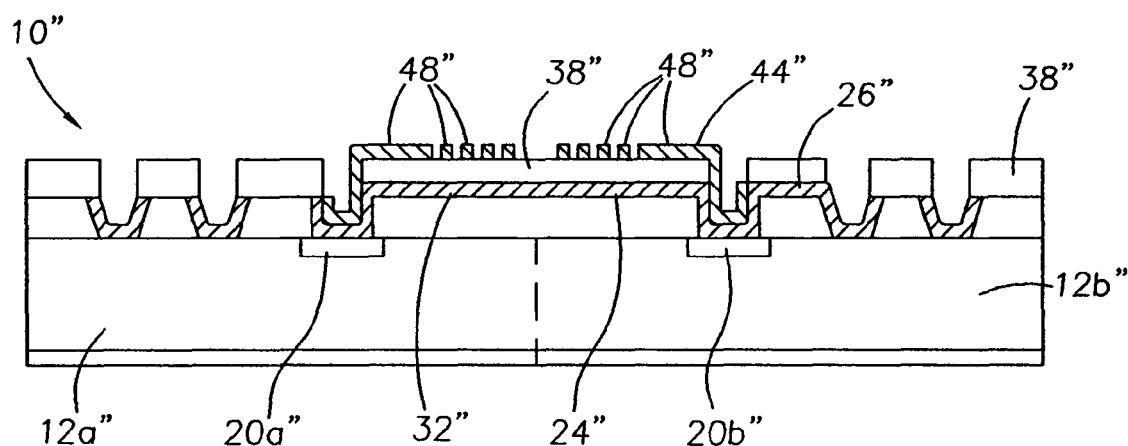
Figure 16:
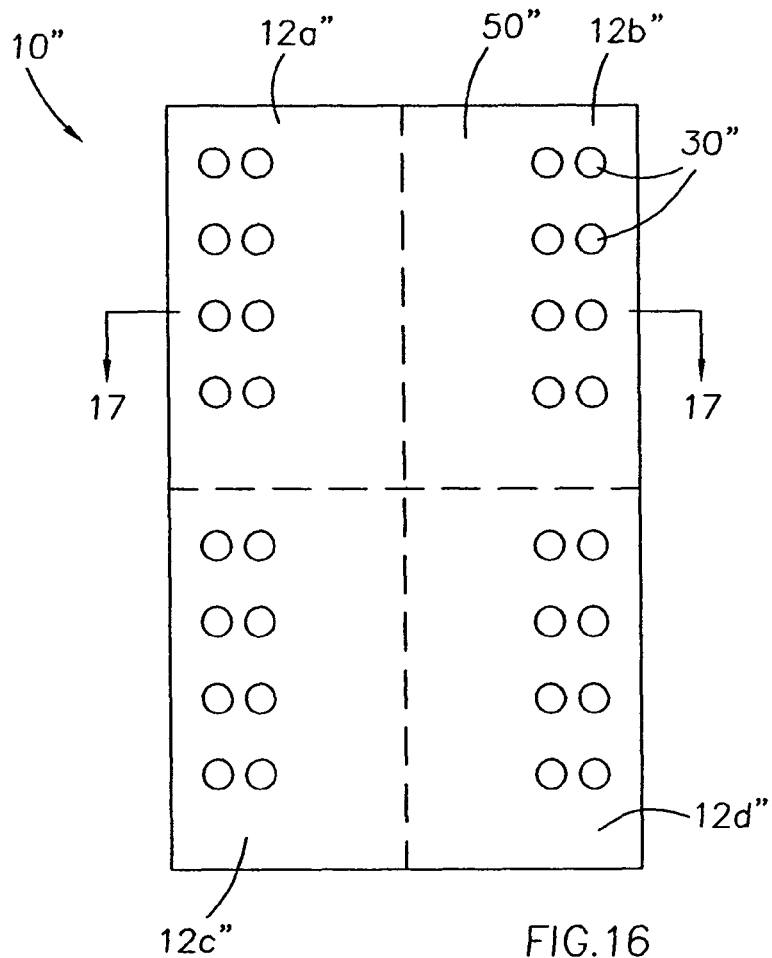
Figure 17:
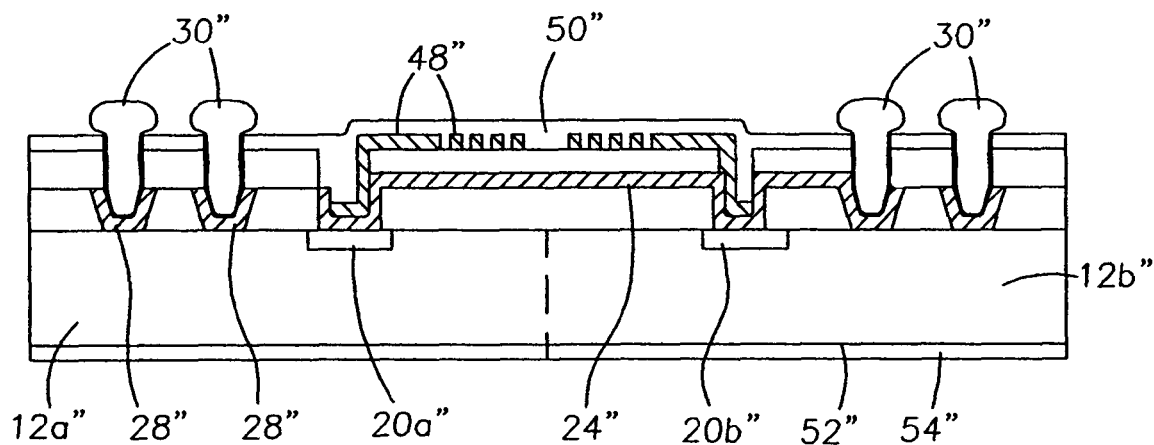

In another embodiment of a wafer level package 10" according to the invention, the package 10" can be fabricated with one or more overlying RDLs to interconnect additional dies within a package, as depicted in FIGS. 12-17. By way of example, an initial RDL layer 24" comprising traces 32" interconnecting the bond pads 20a" to 20b" of the first and second dies 12a", 12b", and the bond pads 20c" to 20d" of the third and fourth dies 12c", 12d" can be fabricated as described with respect to the wafer level package 10 of FIG. 3. As illustrated in FIGS. 12-13, openings 34", 46" are formed through the insulating layer 38", respectively to align with and expose the bond pads 20a"-20d" and ball pads 28" of the initial RDL 24". As depicted in FIGS. 14-15, a second RDL 44" can then be applied onto the insulating layer 38", with traces 48" interconnecting the bond pads 20a" to 20c" of the first and third dies 12a", 12c", and the bond pads 20b" to 20d" of the second and fourth dies 12b", 12d", for example. Thus, all dies 12a"-12d" of the wafer level package 10" are interconnected by means of the interconnecting traces 32", 48" of the first and second RDLs 24", 44". As depicted in FIGS. 16-17, an insulating layer 50" can then be applied over the RDL 44" to form a passive exterior layer, with openings provided to the balls pads 28", and ball contacts 30" can be connected to the ball pads 28".

Figure 18:
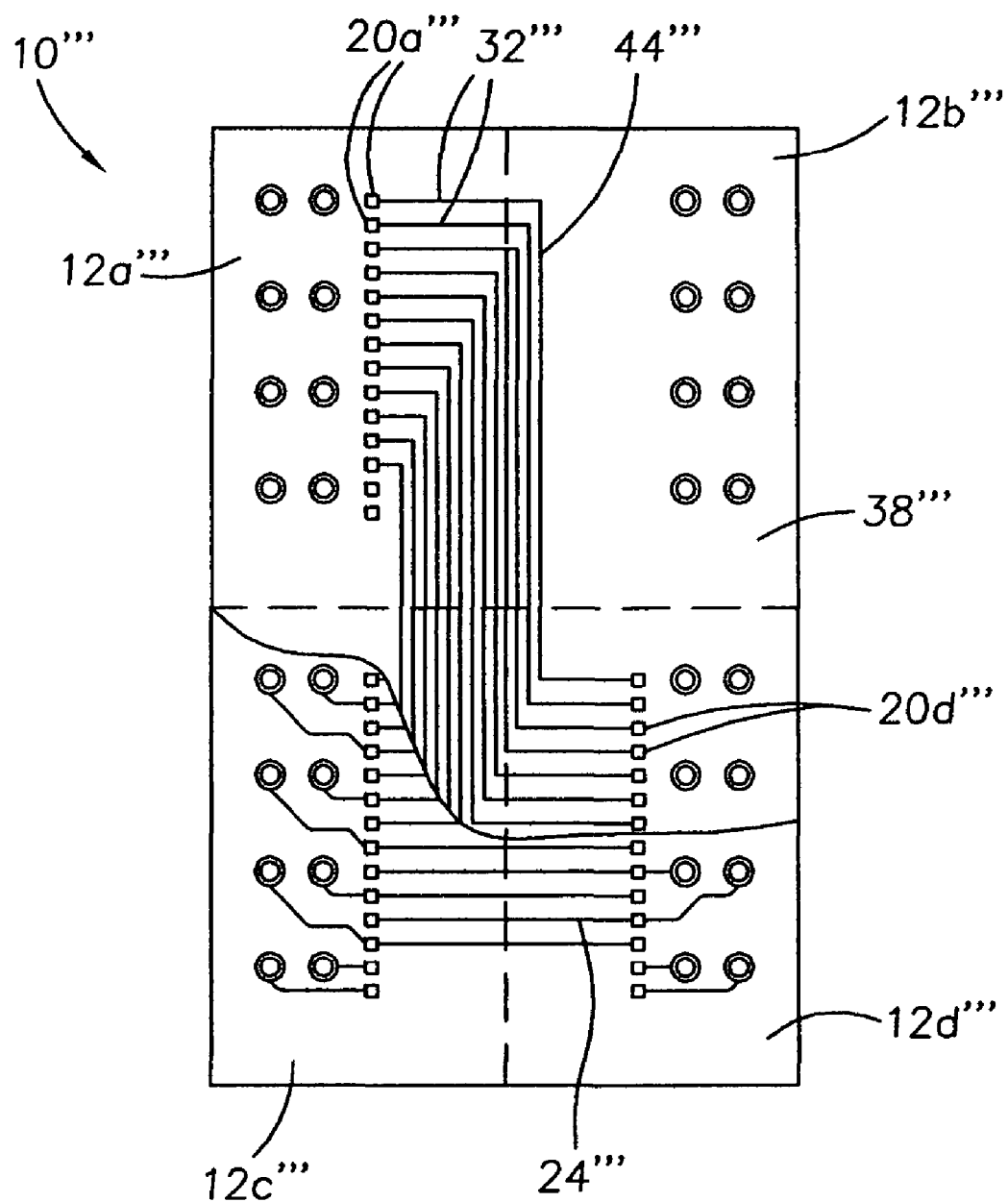
FIG. 18 is a plan view of another embodiment of a wafer level package according to the invention, having a second redistribution layer disposed on a partially cut-away insulating layer overlying a first distribution layer.

Another example of a configuration of a second RDL 44'" is illustrated in FIG. 18. In the illustrated embodiment of a wafer level package 10'", the initial RDL 24'" is configured similar to the RDL 24 shown in FIG. 3. The second RDL 44'" has been fabricated on the insulating layer 38'" such that the traces 32'" interconnect the bond pads 20a'" to the bond pads 20d'" of the first and fourth dies 12a'", 12d'", resulting in the interconnection of all four dies 12a'"-12d'" within the package 10'". Other configurations of two or more RDLs can be utilized to interconnect two or more dies within a wafer level package.

Figure 19:
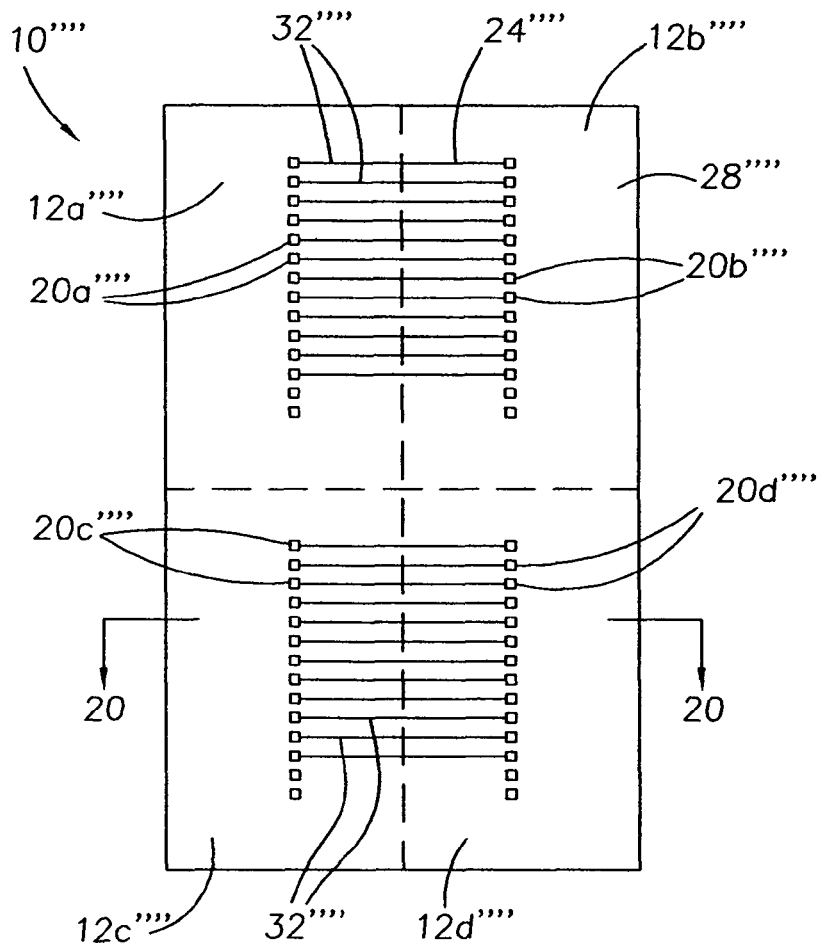
FIGS. 19-27 illustrate sequential processing steps in the fabrication of another embodiment of a wafer level package according to the invention.
Figure 20:
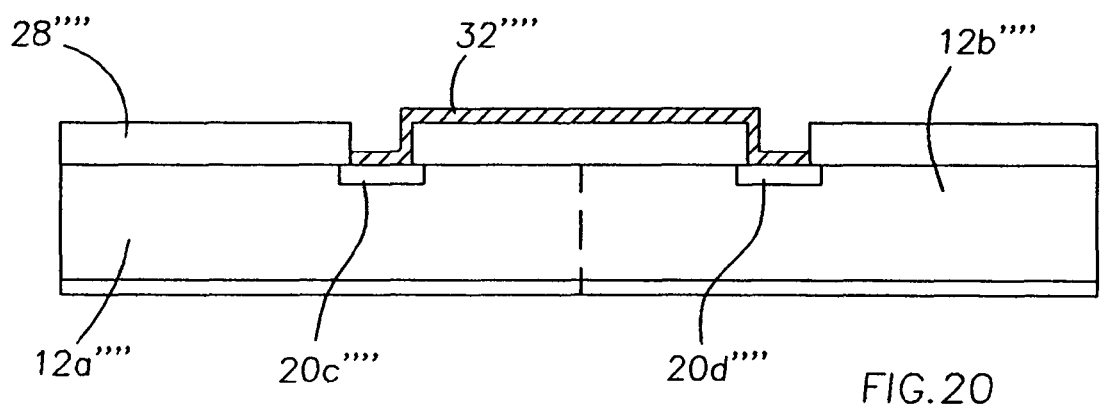
Figure 21:
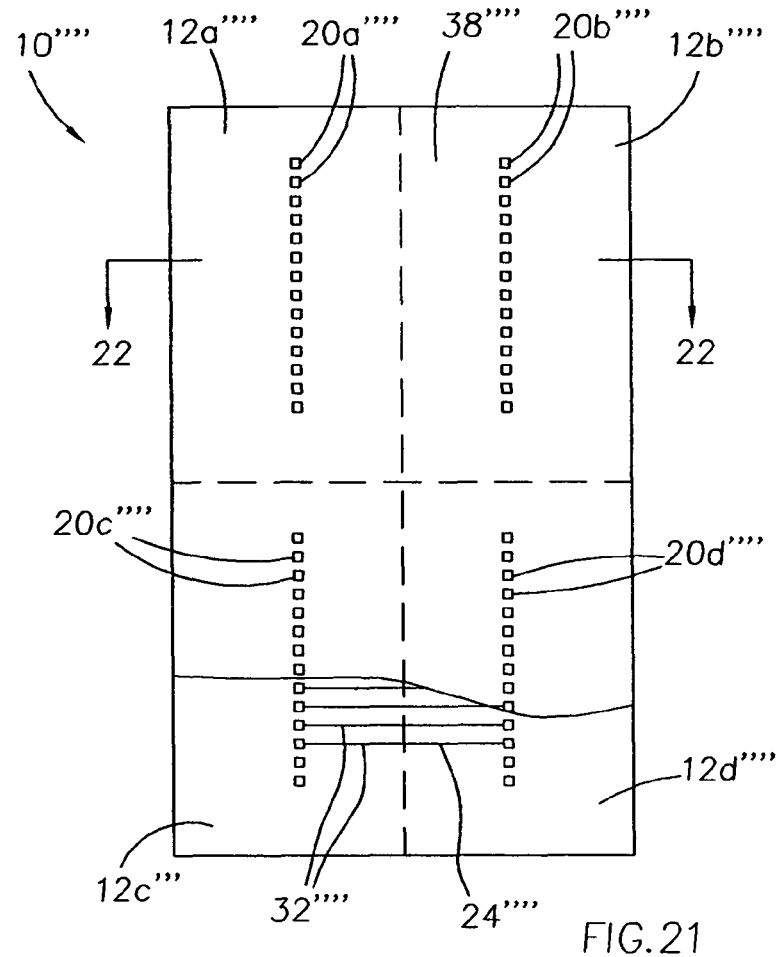
Figure 22:
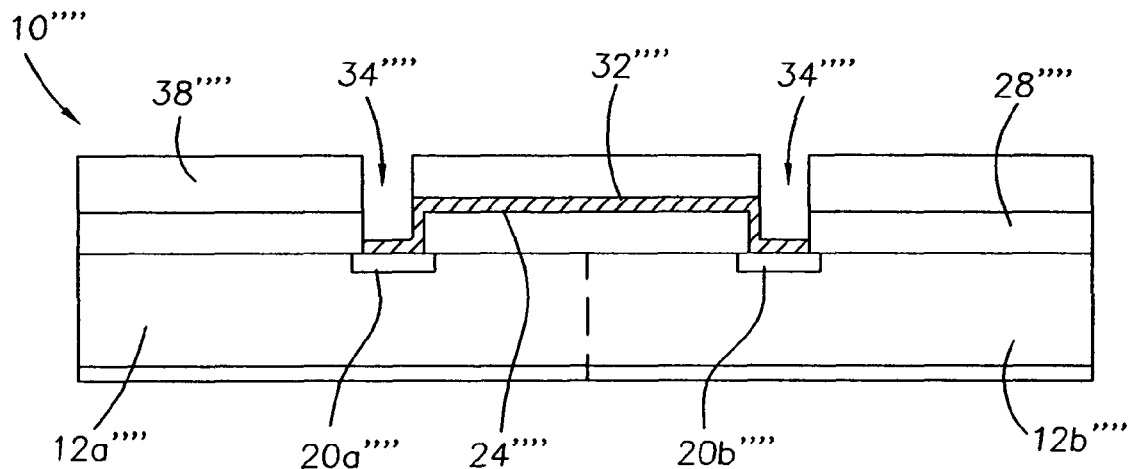
Figure 23:
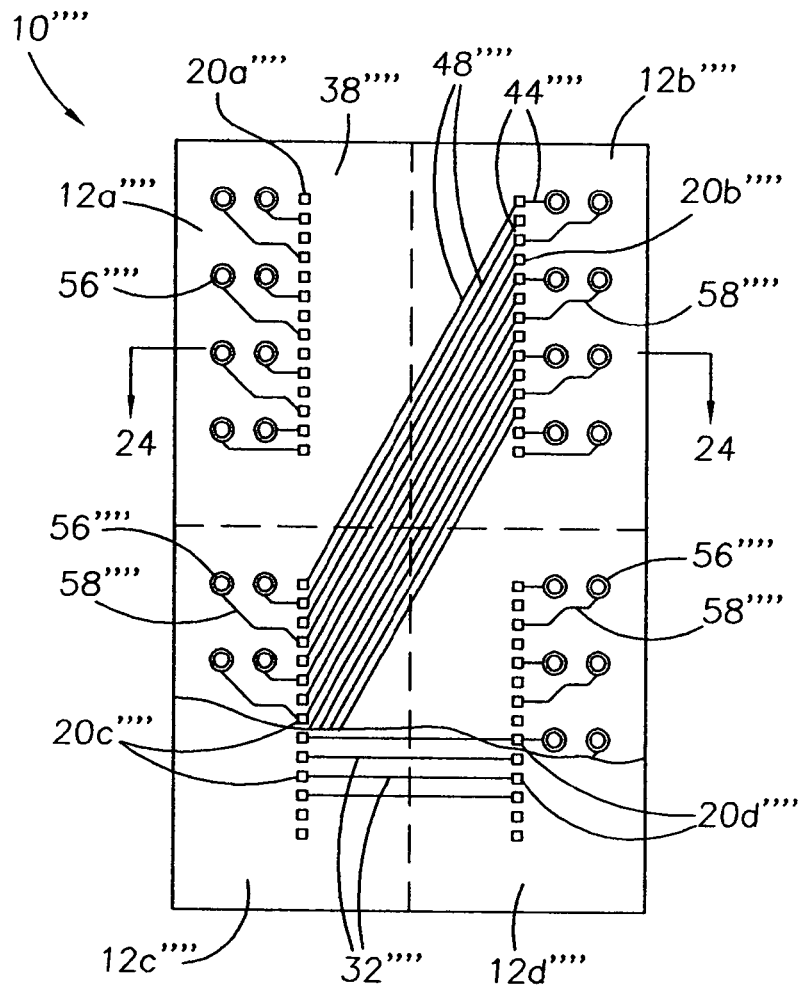
Figure 24:
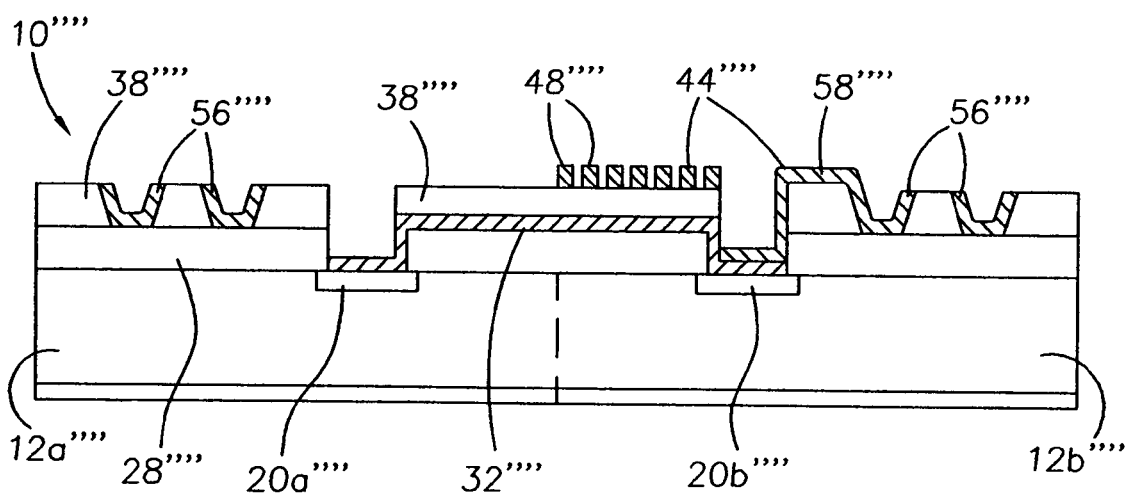

In yet another embodiment of an integrated wafer level package 10"" according to the invention, the package can comprise two or more redistribution layers (RDLs) whereby the ball pads are fabricated as part of the second (or subsequent) RDL. As depicted in FIGS. 19-20, a first RDL 24"" is fabricated on an insulating film 28"". As shown, the RDL 24"" comprises traces 32"" interconnecting the bond pads 20a"" to 20b"" of the first and second dies 12a"", 12b"", and the bond pads 20c"" to 20d"" of the third and fourth dies 12c"", 12d"". An insulating layer 38"" can be applied over the RDL 24"", and openings 34"" formed through the layer to align with and expose the bond pads 20a""-20d"", as illustrated in FIG. 21-22. As shown in FIGS. 23-24, a second RDL 44"" can then be formed on the insulating layer 38"". The RDL 44"" can comprise traces 48"" interconnecting the bond pads of two dies in the packages, illustrated as connecting bond pads 20b"" to 20c"" of the second and third dies 12b"", 12c"", for example. Other trace connections 48"" can be provided as illustrated, for example, in FIGS. 14 and 18.

Figure 25:
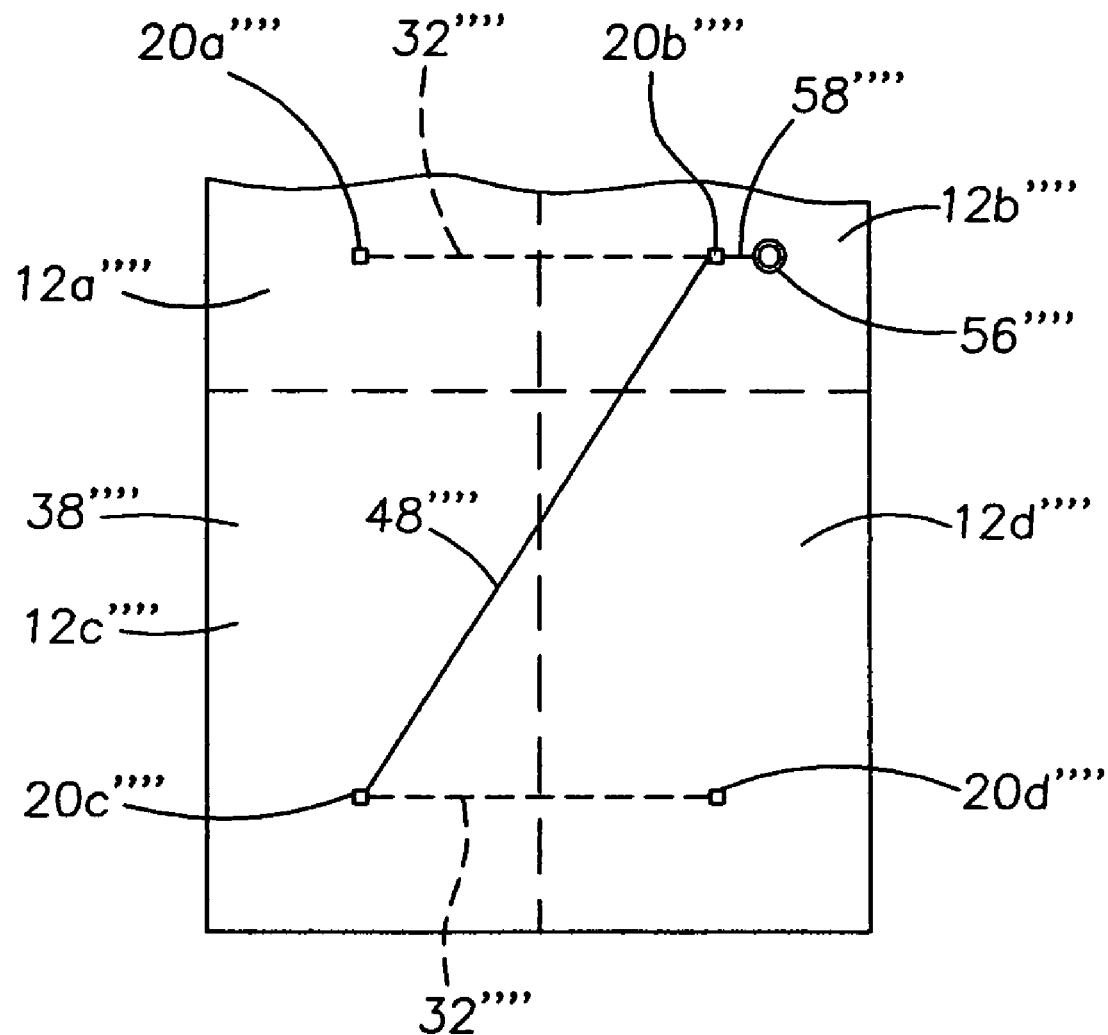
Figure 26:
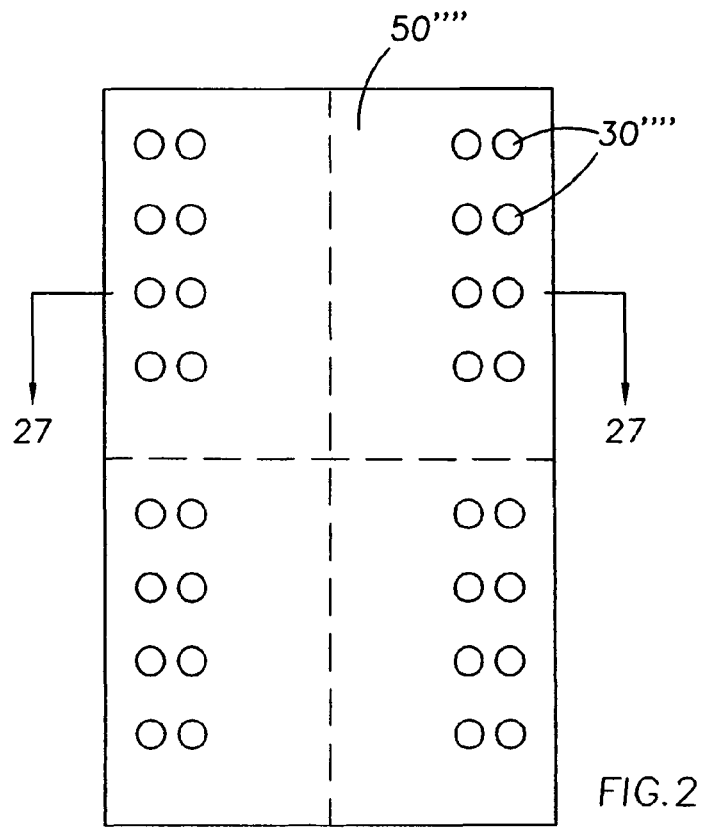
Figure 27:
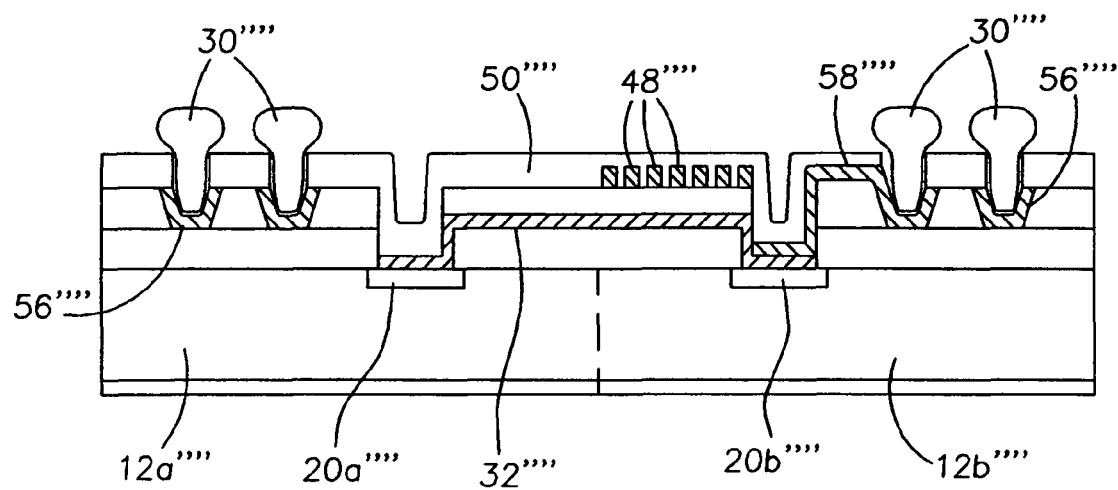
Figure 28:
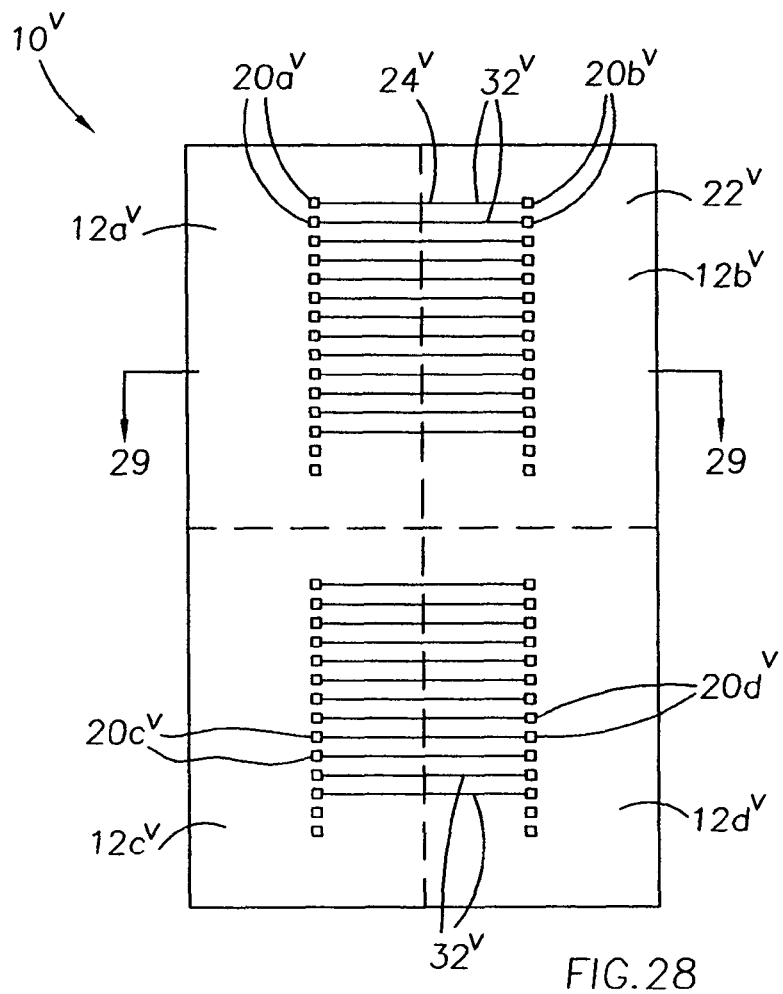
FIGS. 28-36 illustrate sequential processing steps in the fabrication of another embodiment of a wafer level package according to the invention.
Figure 29:
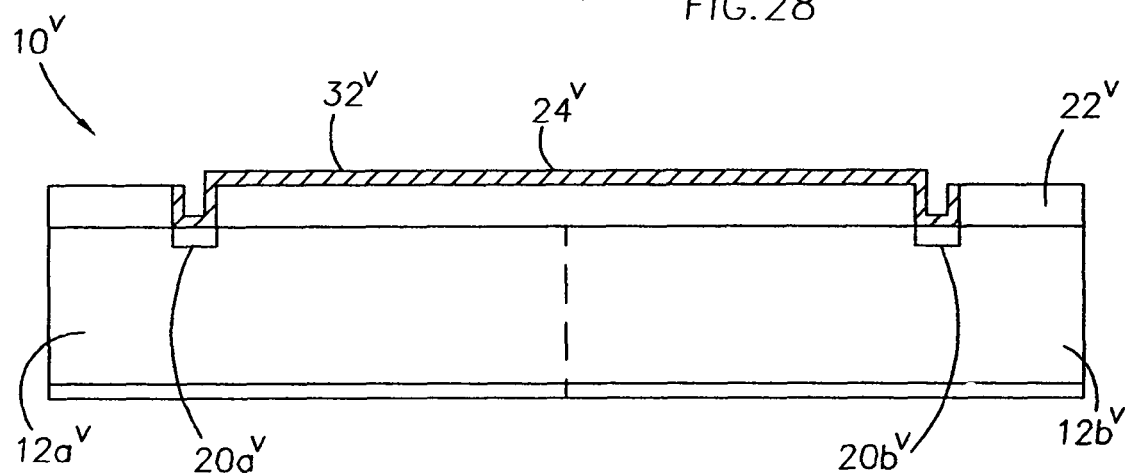

RDL 44"" further comprises ball pads 56"" that are connected through traces 58"" to bond pads 20a""-20d"" of the dies. As in the other wafer level packages, each bond pad of a die communicates with a ball pad 56"" either directly through a trace 58"", or indirectly through the interconnecting trace 32"" and/or 48"" leading to the bond pad of the adjoining die, which is then connected through the trace 58"" to the ball pad 56"". As depicted in FIG. 25, for example, trace 58"" directly connects bond pad 20b"" to the ball pad 56""; and traces 32"", 48"" and/or 58"" indirectly connect bonds pads 20a"", 20c"", and 20d"" to the same ball pad 56"". This results in dies 12a""-12d"" of package 10"" being interconnected to the same ball pad 56"". As depicted in FIGS. 26-27, an insulating layer 50"" can then be applied over the RDL 44"" to form a passive exterior layer, with openings to the ball pads 56"". Ball contacts 30"" can then be connected to the ball pads 56"".

Figure 30:
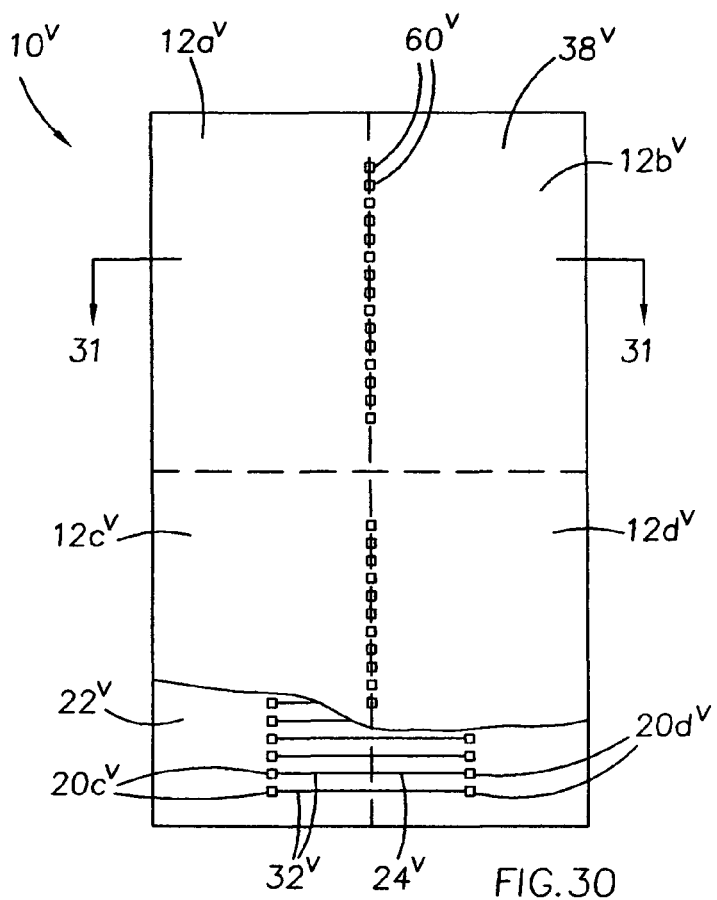
Figure 31:
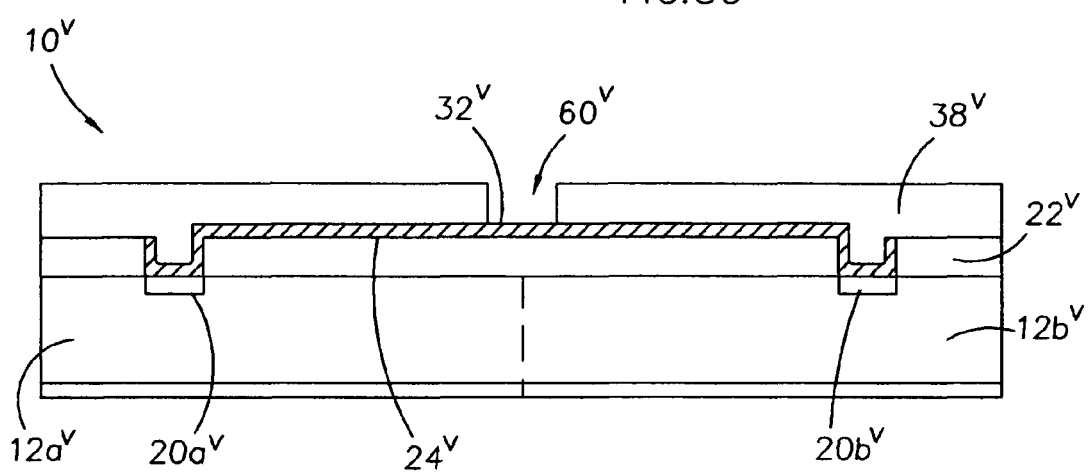

Another embodiment of a wafer level package $10^V$ according to the invention is depicted in FIGS. 28-36. As illustrated, in FIGS. 28-29, initial RDL layer $24^V$ is fabricated on an insulating film $22^V$ disposed over the dies on the wafer surface, and includes traces $32^V$ interconnecting the bond pads $20a^V$ to $20b^V$ of the first and second dies $12a^V$, $12b^V$, and the bond pads $20c^V$ to $20d^V$ of the third and fourth dies $12c^V$, $12d^V$. As shown in FIGS. 30-31, an insulating layer $38^V$ is then applied over the RDL $24^V$ to form a passive layer over the interconnecting traces $32^V$, with openings $60^V$ formed between adjoining dies $12a^V$, $12b^V$ and $12c^V$, $12d^V$ to expose the interconnecting traces $32^V$.

Figure 32:
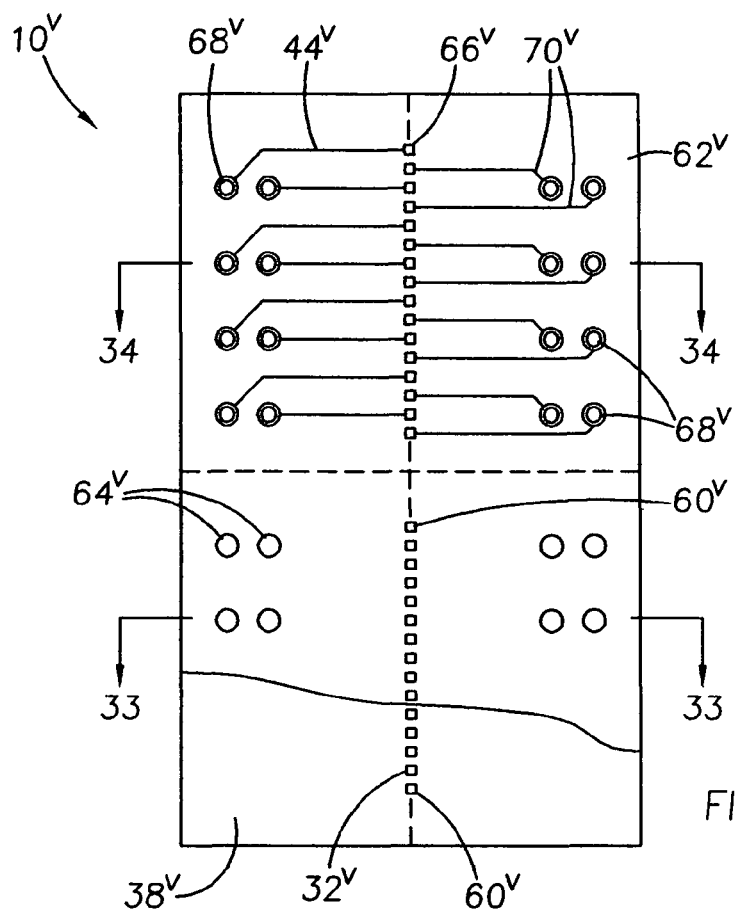
Figure 33:
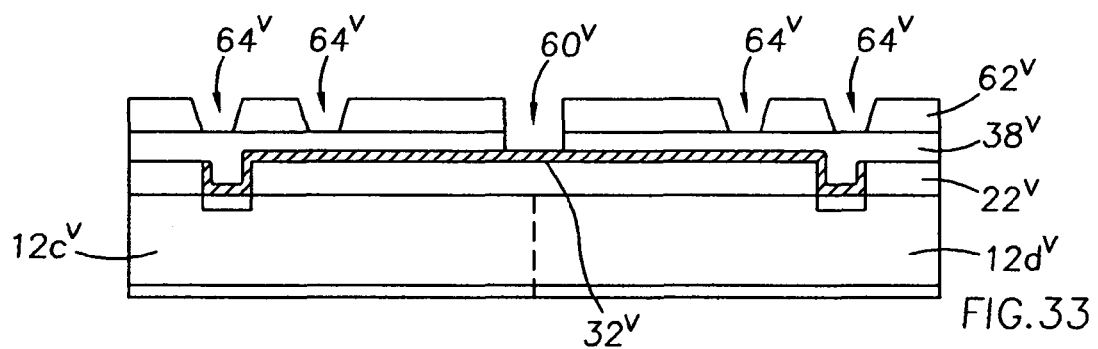
Figure 34:
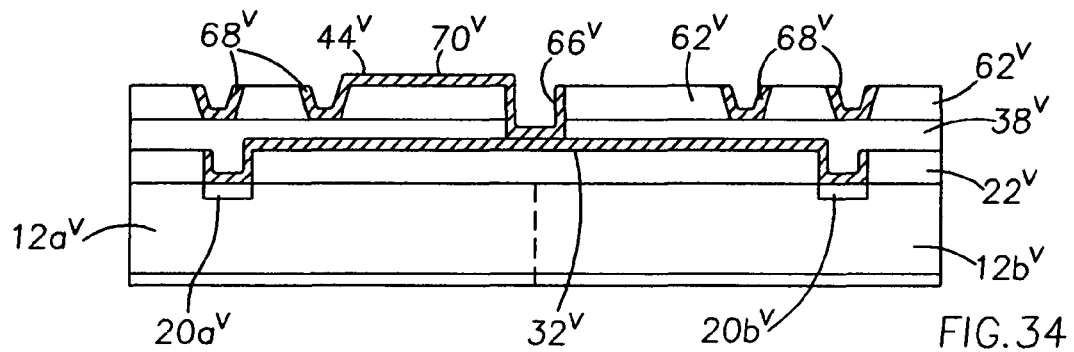
Figure 35:
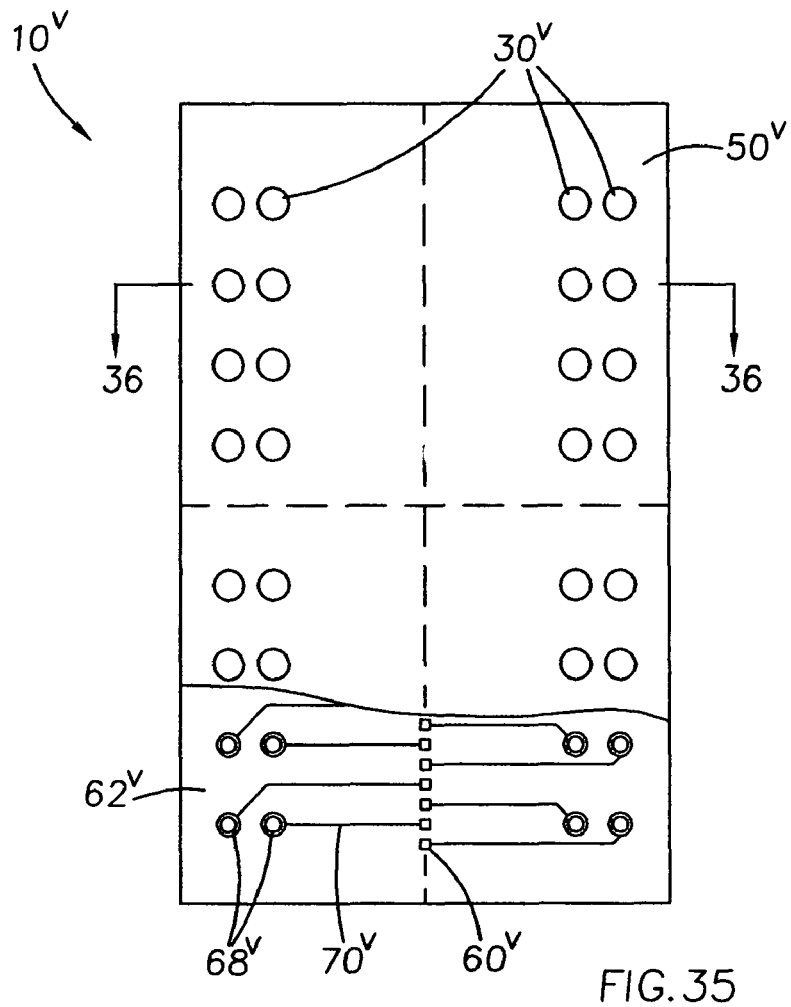
Figure 36:
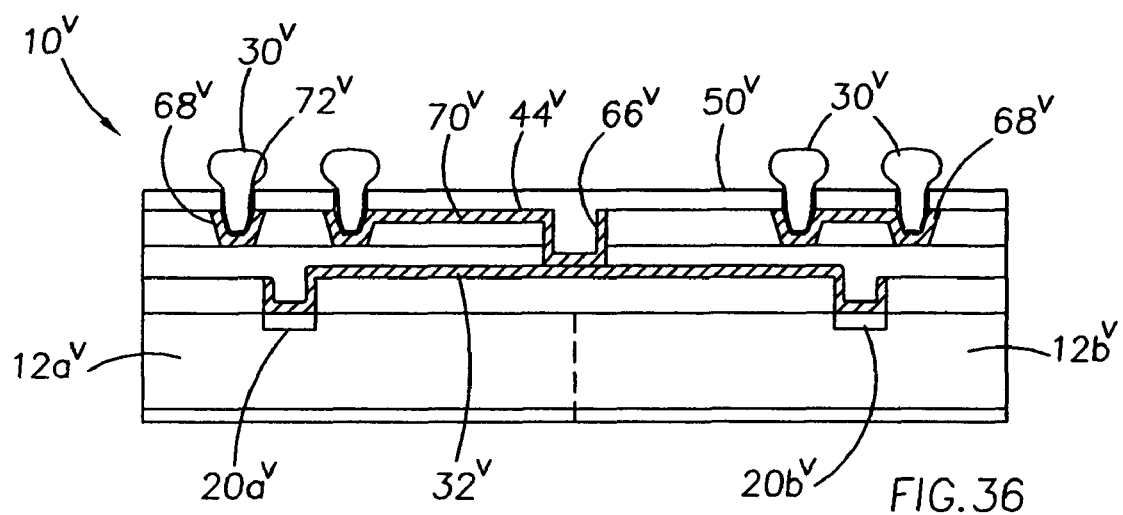

A second insulating layer $62^V$ is formed over the insulating layer $38^V$ as depicted in FIGS. 32-33, and is patterned and etched to provide openings $64^V$ and to extend opening $60^V$. As shown in FIG. 32 and in cross-section in FIG. 34, a second RDL $44^V$ is then applied onto the insulating layer $62^V$ to form via interconnects $66^V$ within opening $60^V$ connected to interconnecting traces $32^V$, ball pads $68^V$, and traces $70^V$ that interconnect the ball pads $68^V$ to every other via interconnect $66^V$ in a staggered arrangement. As depicted in FIGS. 35-36, an insulating layer $50^V$ can then be applied over the second RDL $44^V$ to form a passive exterior layer, with openings $72^V$ to the ball pads $68^V$. Ball contacts $30^V$ can then be connected to the ball pads $68^V$. This arrangement of vias $66^V$ and trace connections $70^V$ of vias $66^V$ to the ball pads $68^V$ provides closely matched RDL lengths from the bond pads $20a^V$, $20b^V$ to the ball pads $68^V$.

Referring to FIG. 2, the inactive surface 52 of the wafer level package 10 can be covered with a protective dielectric layer 54 such as a photoresist or spun-on polyimide, for example, which can be applied after backgrinding of the wafer or other substrate 14, and prior to singulation. Ideally, the electrical testing and burn-in of the dies is performed before the substrate (wafer) 14 is singulated into individual packages 10. The packaged dies 10 can be severed from the substrate (wafer) 14 singularly or in groups as desired. It is also contemplated that an entire unsevered wafer 14 can be tested and burned-in, and then used as fabricated as a wafer-scale package, particularly for large-capacity memory applications. The finished wafer level package 10 can be mounted as a component on an end user's printed circuit board or other external electrical apparatus or device via the ball contacts 30 using known techniques.

Two or more wafer level packages 10 can be combined, for example, into an integrated circuit module to enhance or extend the functionality of individual dice. A circuit module can comprise a combination of dies representing a variety of functions or containing the same functionality. Examples of integrated circuit modules include memory modules, device drivers, power modules, communication modems, processor modules and application-specific modules and may include multilayer, multi-chip modules. Examples of multi-chip modules (MCMs) include a single in-line memory module (SIMM), a dual in-line memory module (DIMM), a random access memory (RAM) card or module, and a read-only-memory (ROM) card or module. The circuit module can be a subcomponent of a variety of electronic systems, for example, a personal computer, cellular phone, clock, television, automobile, industrial control system, among others.

Figure 37:
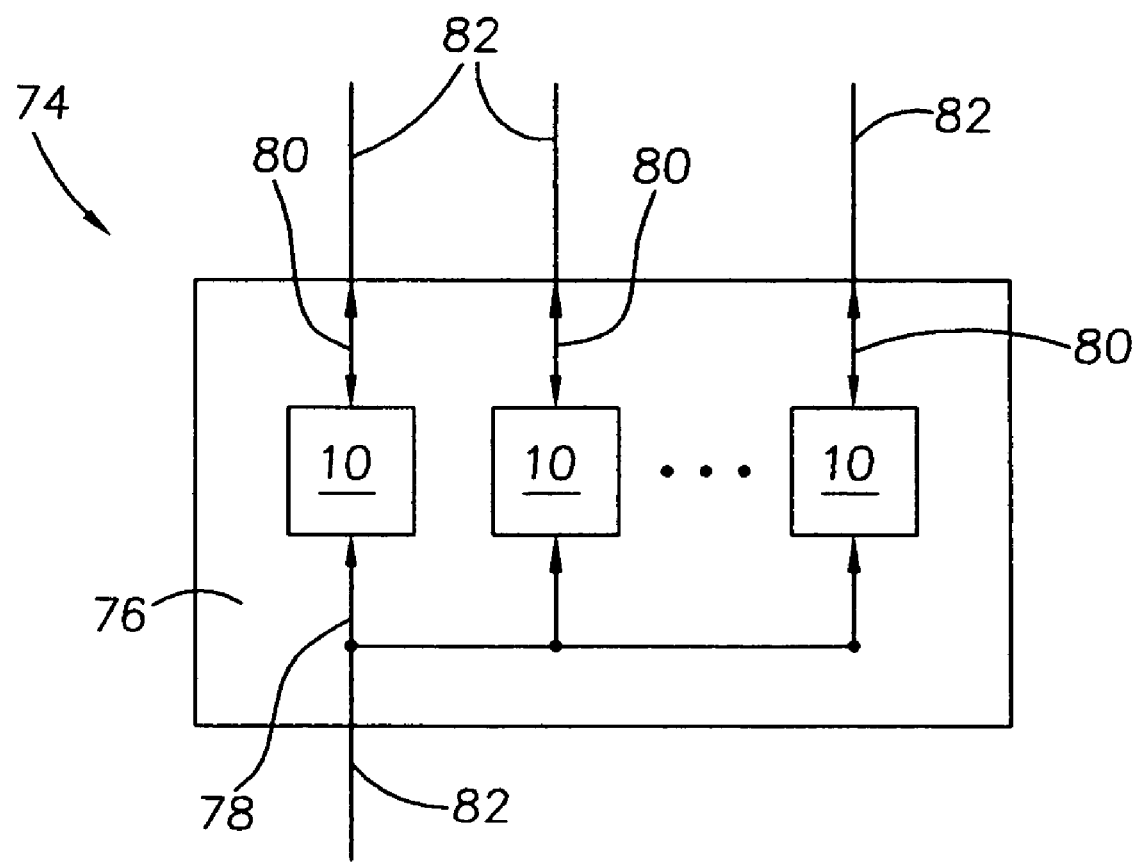
FIG. 37 is a block diagram of a memory module incorporating a plurality of wafer level packages.

FIG. 37 schematically depicts an embodiment of an integrated circuit module as a multi-chip memory module 74, such as a SIMM or DIMM, which are generally a printed circuit board (PCB) or other support containing a series of memory devices, or a memory card or any other memory die-carrying substrate. A SIMM typically comprises a single inline set of contacts or leads, and a DIMM typically comprises a set of leads on each side of the support with each set representing separate I/O signals. As depicted, the memory module 74 comprises multiple wafer level packages 10 disposed on a support 76, the number of packages 10 depending upon the desired bus width and the desire for parity. Wafer level packages 10 can be disposed on both sides of the support 76. Typically, the memory module 74 accepts a command signal from an external controller (not shown) on a command link 78 and provides for data input and data output on data links 80, both of which are connected to leads 82 extending from the support 76.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. An electronic system, comprising:
    an integrated circuit module comprising at least one die package, the at least one die package comprising at least three dies on a substrate in a non-stacked arrangement;
    an insulating film over the dies, openings extending through the insulating film to a bond pad of each of the dies;
    a redistribution layer on the insulating film comprising a first trace interconnecting the bond pad of each of a first die and a second die and a second trace connecting one bond pad to a single ball pad; and
    a third trace directly connecting the interconnected bond pad of either the first die or the second die to a bond pad of a third die;
    wherein the interconnected bond pads are connected to the single ball pad; and
    wherein the third trace is situated on a second insulating film overlying the first and second traces.

2. The electronic system of claim 1, wherein the integrated circuit module comprises a multi-chip module.

3. The electronic system of claim 2, wherein the multi-chip module is selected from the group consisting of a single in-line memory module, a dual in-line memory module, a random access memory card or module, and a read-only-memory card or module.

4. The electronic system of claim 1, wherein at least one die comprises integrated circuitry to perform a memory function.

5. An electronic system, comprising:
    an integrated circuit module comprising at least one die package, the package comprising at least three dies in a non-stacked arangement on a substrate,
    a first insulating layer over the dies with openings to bond pads of first and second dies,
    a first trace on the first insulating layer directly connecting the bond pad of each of the first die and the second die and directly connecting one of said bond pads to a ball pad such that said interconnected bond pads are connected to a single ball pad,
    a second insulating layer over the final trace, and
    a second trace on the second insulating layer directly connecting one of said interconnected bond pads of either the first die or the second die to a bond pad of a third die, wherein said interconnected bond pads of the first, second and third dies are connected to the single ball pad.

6. An electronic system, comprising;
    an integrated circuit module comprising at least one die package, the package comprising at least three dies in a non-stacked arrangement on a substrate,
    a first redistribution layer on a first insulating layer over the dies and comprising a first trace interconnecting a bond pad of each of the first and second dies,
    a second insulating layer over the first redistribution layer with openings extending to said first trace and to a bond pad of a third die, and
    a second redistribution layer over the second insulating layer and comprising a second trace, a ball pad, and a via interconnect within the opening in direct contact with the first trace, the second trace directly connecting the via interconnect to the ball pad and to the bond pad of the third die, wherein said bond pads of the first, second and third dies are connected to the single ball pad.

7. The system of claim 6, wherein the substrate comprises a semiconductor wafer.

8. The system of claim 6, wherein the die package comprises a wafer level package.

9. An electronic system, comprising:
    an integrated circuit module comprising at least one die package, the package comprising at least three dies in a non-stacked arrangement on a substrate,
    a first insulating layer over the dies,
    a first trace on the first insulating layer interconnecting a bond pad of each of a first and second die and one of said bond pads directly to a single ball pad on the first insulating layer,
    a second insulating layer over said first trace, and
    a second trace on the second insulating layer directly interconnecting a bond pad of either the first or second die to a bond pad of a third die, wherein said interconnected bond pads are connected to said single ball pad.

10. An electronic system, comprising:
    an integrated circuit module comprising a die package, the package comprising at least four dies in a non-stacked arrangement on a substrate,
    a first insulating layer over the dies, a first trace on the first insulating layer solely interconnecting a bond pad of each of a first and second die and one of said bond pads directly to a single ball pad on the first insulating layer,
a second insulating layer over said first trace with openings to the ball pad, to the interconnected bond pad of at least one of the first and second dies and to the bond pond of a third die, and
a second trace on the second insulating layer directly interconnecting the bond pad of either the first or second die to the bond pad of a third die, wherein said interconnected bond pads are connected to said single ball pad.

11. An electronic system, comprising:
an integrated circuit module comprising a die package, the package comprising at least four dies in a non-stacked arrangement on a substrate,
a first insulating layer over the dies with openings to bond pads on said dies,
a first trace on the first insulating layer connecting a bond pad of each of a first and second die,
a second insulating layer over said first trace with openings to the first trace and the bond pad of a third die, and
a second trace on the second insulating layer connecting the first trace directly to said bond pad of the third die and to a ball pad on the second insulating layer, wherein said interconnected bond pads are connected to a single ball pad.

12. An electronic system, comprising:
an integrated circuit module comprising a die package, the package comprising at least four dies in a non-stacked arrangement on a substrate,
a first insulating layer over the dies with openings to bond pads on said dies,
a first trace on the first insulating layer solely connecting a bond pad of each of a first and second die and a second trace on the first insulating layer solely connecting a bond pad of each of a third and fourth die,
a second insulating layer over said first and second traces with an opening to the first trace and to the bond pad of either the third or fourth die, and
a third trace on the second insulating layer directly connecting the first trace to the interconnected bond pad of the third or fourth die and to a ball pad on the second insulating layer, wherein said interconnected bond pads are connected to a single ball pad.

13. The system of claim 12, further comprising a third insulating layer over the third trace on the second insulating layer with an opening to the ball pad.

14. The system of claim 12, further comprising a ball contact mounted on the ball pad.

15. A memory module, comprising:
a printed circuit board; and
an integrated circuit module comprising at least one die package, the at least one die package comprising at least three dies in a non-stacked arrangement on a substrate;
a first insulating film over the dies, openings in the first insulating film extending to a bond pad of each of the dies;
a redistribution layer on the first insulating film comprising a first trace interconnecting the bond pad of each of a first die and a second die and a second trace connecting one bond pad to a single ball pad;
a second insulating film over the first and second traces; and
a third trace on the second insulating film and directly connecting the interconnected bond pad of either the first die or the second die to a bond pad of a third die;
wherein the interconnected bond pads are connected to the single ball pad.

16. The memory module of claim 15, wherein the integrated circuit module comprises a multi-chip module.

17. The memory module of claim 16, wherein the multi-chip module is selected from the group consisting of a single in-line memory module, a dual in-line memory module, a random access memory card or module, and a read-only-memory card or module.

18. A memory module, comprising:
a printed circuit board; and
an integrated circuit module comprising at least one die package, the package comprising at least three dies in a non-stacked arrangement on a substrate,
a first insulating layer over the dies with openings to bond pads of first and second dies,
a first trace on the first insulating layer directly connecting the bond pad of each of the first die and second die and directly connecting one of said bond pads to a ball pad such that said interconnected bond pads are connected to a single ball pad,
a second insulating layer over the first trace, and
a second trace on the second insulating layer directly connecting one of said interconnected bond pads of either the first die or the second die to a bond pad of a third die, wherein said interconnected bond pads of the first, second and third dies are connected to the single ball pad.

19. A memory module, comprising:
a printed circuit board; and
an integrated circuit module comprising at least one die package, the package comprising at least three dies in a non-stacked arrangement on a substrate,
a first insulating layer over the dies,
a first redistribution layer on the first insulating layer and comprising a first trace interconnecting a bond pad of each of first and second dies,
a second insulating layer over the first redistribution layer with openings to said first trace of the first redistribution layer and to a bond pad of a third die, and
a second redistribution layer over the second insulating layer, the second redistribution layer comprising a second trace, a ball pad, and a via interconnect within the opening in direct contact with the first trace, the second trace directly connecting the via interconnect to the ball pad and to the bond pad of the third die, wherein said bond pads of the first, second and third dies are connected to a single ball pad.

20. A memory module, comprising:
a printed circuit board; and
an integrated circuit module comprising at least one die package, the package comprising at least three dies in a non-stacked arrangement on a substrate,
a first insulating layer over the dies,
a first trace on the first insulating layer interconnecting a bond pad of each of a first and second die and one of said bond pads directly to a single ball pad on the first insulating layer,
a second insulating layer over said first trace, and
a second trace on the second insulating layer directly interconnecting a bond pad of either the first or second die to a bond pad of a third die, wherein said interconnected bond pads are connected to said single ball pad.

21. A memory module, comprising:
a printed circuit board; and
an integrated circuit module comprising a die package, the package comprising at least four dies in a non-stacked arrangement on a substrate, a first insulating layer over the dies with openings to bond pads on said dies,
a first trace on the first insulating layer solely interconnecting a bond pad of each of a first and second die and a second trace on the first insulating layer solely interconnecting a bond pad of each of a third and fourth die,
a second insulating layer over said first and second traces with an opening to the first trace and to the bond pad of either the third or fourth die, and
a third trace on the second insulating layer directly interconnecting the first trace to the interconnected bond pad of the third or fourth die and to a ball pad on the second insulating layer, wherein said interconnected bond pads are connected to a single ball pad.

22. A memory module, comprising:
a printed circuit board; and
an integrated circuit module comprising a die package, the package comprising at least four dies in a non-stacked arrangement on a substrate,
a first insulating layer over the dies,
a first trace on the first insulating layer solely connecting a bond pad of each of a first and second die and one of said bond pads directly to a single ball pad on the first insulating layer,
a second insulating layer over said first trace with openings to the ball pad, to the interconnected bond pad of at least one of the first and second dies and to the bond pond of a third die, and
a second trace on the second insulating layer directly connecting the bond pad of either the first or second die to the bond pad of a third die, wherein said interconnected bond pads are connected to said single ball pad.

23. A memory module, comprising:
a printed circuit board; and
an integrated circuit module comprising a die package, the package comprising at least four dies in a non-stacked arrangement on a substrate,
a first insulating layer over the dies with openings to bond pads on said dies,
a first trace on the first insulating layer solely connecting a bond pad of each of a first and second die and a second trace on the first insulating layer solely connecting a bond pad of each of a third and fourth die,
a second insulating layer over said first and second traces with an opening to the first trace and to the bond pad of either the third or fourth die and
a third trace on the second insulating layer directly connecting the first trace to the interconnected bond pad of the third or fourth die and to a ball pad on the second insulating layer, wherein said interconnected bond pads are connected to a single ball pad.

24. The electronic system of claim 1, wherein the substrate comprises a semiconductor wafer.

25. The electronic system of claim 1, wherein the at least one die package comprises a wafer level package.

26. An electronic system, comprising,
an integrated circuit module comprising at least one die package, the at least one package comprising at least three dies in a non-stacked arrangement on a substrate;
an insulating film over the dies, openings extending through the insulating film to a bond pad of each of the dies;
a redistribution layer on the insulating film, the redistribution layer comprising a first trace interconnecting the bond pad of each of a first die and a second die and a second trace connecting one bond pad to a single ball pad; and
a third trace directly connecting the interconnected bond pad of either the first die or the second die to a bond pad of a third die;
wherein the interconnected bond pads are connected to the single ball pad; and
wherein the third trace connecting the interconnected bond pad of the first die or the second die to the bond pad of the third die is situated on a second insulating film overlying the first trace interconnecting the bond pads of the first and second dies.

27. An electronic system, comprising:
an integrated circuit module comprising at least one die package, the at least one package comprising at least three dies in a non-stacked arrangement on a substrate;
an insulating material over the dies;
a first trace on the insulating material interconnecting a bond pad of each of a first die and a second die and a second trace directly connecting one bond pad to a single ball pad;
a second insulating material over the first and second traces; and
a third trace on the second insulating material directly connecting the interconnected bond pad of either the first die or the second die to a bond pad of a third die, wherein the interconnected bond pads of the first, second and third dies are connected to the single ball pad.

28. An electronic system, comprising:
an integrated circuit module comprising at least one die package, the at least one package comprising at least three dies in a non-stacked arrangement on a substrate;
an insulating material over the dies;
a first trace on the insulating material interconnecting a bond pad of each of a first die and a second die and a second trace directly connecting one bond pad to a single ball pad; and
a third trace directly connecting the interconnected bond pad of either the first die or the second die to a bond pad of a third die;
wherein the interconnected bond pads of the first, second and third dies are connected to the single ball pad; and
wherein the second trace is situated on a second insulating material overlying the first trace.

29. An electronic system, comprising:
an integrated circuit module comprising at least one die package, the at least one package comprising at least three dies in a non-stacked arrangement on a substrate;
an insulating material overlying the dies;
a first trace on the insulating material interconnecting a bond pad of each of a first die and a second die and a second trace directly connecting one bond pad to a single ball pad;
a second insulating material overlying the first and second traces; and
a third trace on the second insulating material and directly connecting the bond pad of either the first die or the second die to a bond pad of a third die, wherein the interconnected bond pads are connected to the single ball pad.

30. An electronic system, comprising:
an integrated circuit module comprising at least one die package, the at least one package comprising at least three dies in a non-stacked arrangement on a substrate;
first insulating material overlying the dies;
a first trace on the first insulating material interconnecting a bond pad of each of a first die and a second die and a second trace directly connecting one bond pad to a single ball pad;

a second insulating material overlying the first trace connecting the bond pads of the first and second dies; and a third trace situated on the second insulating material and directly connecting the bond pad of either the first die or the second die to a bond pad of a third die;

wherein the interconnected bond pads are connected to the single ball pad.

31. An electronic system, comprising:

an integrated circuit module comprising at least one die package, the at least one die package comprising at least three dies in a non-stacked arrangement on a substrate;

a first insulating material overlying the dies;

a bond pad of each of a first die and a second die being interconnected by a first trace situated on the first insulating material;

a second insulating material overlying the first trace;

one of the interconnected bond pads of the first and second dies being directly connected to a single ball pad by a second trace; and the interconnected bond pad of either the first die or the second die being directly connected to a bond pad of a third die by a third trace;

wherein the second and third traces are situated on the second insulating material; and wherein the interconnected bond pads of the first, second and third dies are connected to the single ball pad.

* * * * *

UNITED STATES PATENT AND TRADEMARK OFFICE
CERTIFICATE OF CORRECTION

| | | |
|---|---|---|
| PATENT NO. | : 8,304,894 B2 | Page 1 of 1 |
| APPLICATION NO. | : 11/712152 | |
| DATED | : November 6, 2012 | |
| INVENTOR(S) | : Yong Poo Chia et al. | |

It is certified that error appears in the above-identified patent and that said Letters Patent is hereby corrected as shown below:

In the Specifications:

In column 1, line 9, delete "whichclaims" and insert -- which claims --, therefor.

In the Claims:

In column 12, line 11, in Claim 5, delete "arangement" and insert -- arrangement --, therefor.

In column 12, line 20, in Claim 5, delete "final" and insert -- first --, therefor.

In column 12, line 26, in Claim 6, delete "comprising;" and insert -- comprising: --, therefor.

In column 12, line 32, in Claim 6, after "of" delete "the".

In column 13, line 7, in Claim 10, delete "pond" and insert -- pad --, therefor.

In column 15, line 27, in Claim 22, delete "pond" and insert -- pad --, therefor.

Signed and Sealed this
Sixteenth Day of April, 2013

Teresa Stanek Rea
*Acting Director of the United States Patent and Trademark Office*